United States Patent
Derbenwick et al.

(10) Patent No.: US 6,900,536 B1
(45) Date of Patent: May 31, 2005

(54) METHOD FOR PRODUCING AN ELECTRICAL CIRCUIT

(75) Inventors: Gary F. Derbenwick, Colorado Springs, CO (US); Alan D. DeVilbiss, Colorado Springs, CO (US)

(73) Assignee: Celis Semiconductor Corporation, Colorado Springs, CO (US)

( * ) Notice: Subject to any disclaimer, the term of this patent is extended or adjusted under 35 U.S.C. 154(b) by 177 days.

(21) Appl. No.: 10/132,939

(22) Filed: Apr. 26, 2002

(51) Int. Cl.$^7$ ............................................. H01L 23/34
(52) U.S. Cl. ................ 257/724; 257/723; 257/738; 257/737; 257/782; 257/783
(58) Field of Search ................. 257/723–724, 257/737–738, 782–783

(56) References Cited

U.S. PATENT DOCUMENTS 6,300,679 B1 * 10/2001 Mukerji et al. ............. 257/738
6,486,544 B1 * 11/2002 Hashimoto .................. 257/686

* cited by examiner

Primary Examiner—Luan Thai
(74) Attorney, Agent, or Firm—Mark G. Pannell; Hanes & Schutz, P.C.

(57) ABSTRACT

An electrical circuit is formed by forming and patterning a conductive layer on a substrate, forming and patterning a conductive layer on another substrate, depositing a dielectric layer on at least a portion of one of conductive layers, mounting an integrated circuit (IC) between the substrates, coupling the IC to the conductive layers, and affixing the substrates together with the conductive layers between the substrates. These are either separate substrates or a unitary substrate. The IC is mounted either to a substrate, a conductive layer, or a dielectric layer. The IC is coupled to the conductive layers either directly or through openings formed in the dielectric layer. An interior conductive layer may be used to couple the IC to the conductive layers.

28 Claims, 26 Drawing Sheets

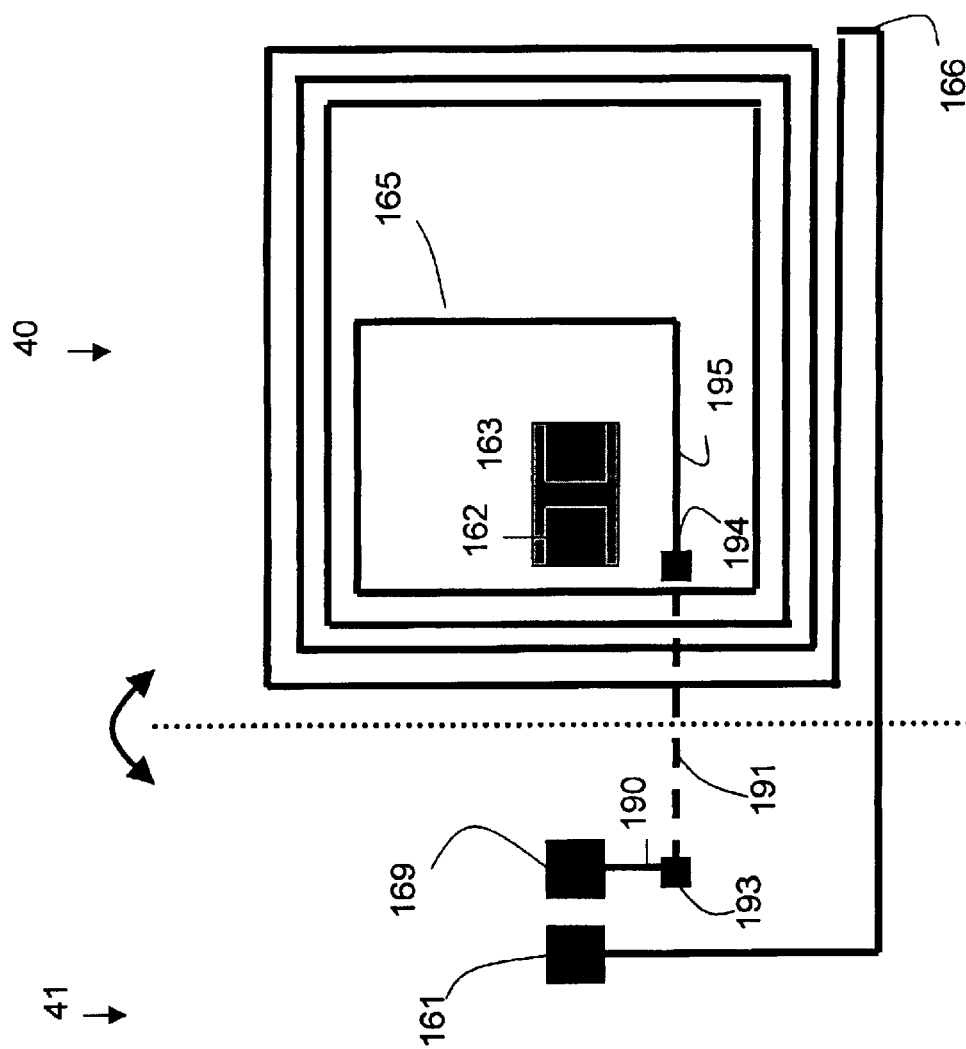

METHOD FOR PRODUCING AN ELECTRICAL CIRCUIT

FIELD OF THE INVENTION

This invention relates in general to integrated circuits, and more particularly, to a method of producing ah electrical circuit having an integrated circuit.

BACKGROUND OF THE INVENTION

Radio frequency identification (RFID) transponders (tags) are usually used in conjunction with an RFID base station, typically in applications such as inventory control, security, access cards, and personal identification. The base station transmits a carrier signal that powers circuitry in the RFID tag when the RFID tag is brought within a read range of the base station. Data communication between the tag and the station is achieved by modulating the amplitude of the carrier signal with a binary data pattern, usually amplitude shift keying. To that end, RFID tags are typically integrated circuits that include, among other components, antenna elements for coupling the radiated field, tuning capacitors to form circuits that resonate at the carrier frequency, rectifiers to convert the AC carrier signal to dc power, and demodulators to extract the data pattern from the envelope of the carrier signal.

If fabricated at sufficiently low cost, RFID tags can also be useful in cost-sensitive applications such as product pricing, baggage tracking, parcel tracking, asset identification, authentication of paper money, and animal identification, to mention just a few applications. RFID tags could provide significant advantages over systems conventionally used for such applications, such as bar code identification systems. For example, a basket full of items marked with RFID tags could be read rapidly without having to handle each item, whereas they would have to be handled individually when using a bar code system. Unlike bar codes, RFID tags provide the ability to update information on the tag. However, the RFID technology of today is too expensive for dominant use in such applications. There are several factors that drive up the cost of RFID tags, such as the size of the silicon integrated circuit and production costs associated with attaching the integrated circuit and external resonant circuit components onto a single substrate.

One method of reducing costs of RFID tags known in the prior art is to provide the relatively large electronic components that make up the resonant circuit of the RFID tag on a substrate on which the integrated circuit is also mounted and connected. Such components include inductor coil antennas, dipole antennas, fractal antennas, tuning capacitors, and conductive traces to interconnect them. The conductor layer is typically printed using conductive ink, formed using silk screening techniques, chemically etched, or stamped in a suitable metal foil and adhered to the substrate.

When appropriate components and conductive patterns are formed on the substrate, the integrated circuit is then mounted and electrically connected using conventional chip attachment methods.

One conventional technique known in the prior art for forming the antenna on the substrate and making the attachment of the integrated circuit is illustrated with FIG. 1 and FIG. 2.

FIG. 1 is a top view of a prior art structure. Inductor 3 is formed on a substrate 1. Inductor 3 has an inner terminal 7 and an outer terminal 11. Integrated circuit 5 is mounted upside down on substrate 1, such that the conductive contact pads on substrate 1 align with contact pads on integrated circuit 5.

FIG. 2 illustrates a cross sectional view of the prior art, using the same numerical markers for the same elements as in FIG. 1. Connection to integrated circuit 5 is achieved by mounting the, integrated circuit upside down so that pads 27 and 28 on integrated circuit 5 align with contact pad 7 and 9 on substrate 1, respectively.

Referring again to FIG. 1, since inductor 3 generally includes several loops that are larger than integrated circuit 5, it becomes necessary to route a conductor trace 13 from the outer terminal 11 of coil inductor 3 to a contact pad 9 on the substrate in the center of coil inductor 3 in order that pads 7, 9 on substrate 1 for both antenna terminals are sufficient closely spaced to align with pads 27, 28 on integrated circuit 5. In order that conductor 13 does not short the conductor traces that makes up inductor coil 3 where the conductors intersect, conductor 13 must be formed on a second conductive layer.

FIG. 2 illustrates one technique known in the prior art wherein conductor 13 is formed on the back surface of substrate 1, making connections 15, 16 through openings in the substrate in order to connect the conductors on the two sides of the substrates.

FIG. 3 illustrates another technique known in the prior art. Conductor 13 is formed on a first conductive layer oh the substrate 1. Dielectric layer 19 is formed on the first conductive layer. A second conductive layer is formed on dielectric 19, appropriate openings 17, 18) made in dielectric 19 in order to connect conductors between the two conductive layers.

Whether forming a second conductive layer on the back surface of the substrate or forming a second conductive layer on top of a dielectric formed on a first conductive layer on the substrate, significant production costs are associated with having to form and pattern a second conductivity layer.

SUMMARY OF THE INVENTION

The present invention provides a method for producing an electrical circuit, such as an RFID tag, on a substrate utilizing, simple and economical methods to form antenna structures, capacitor structures and conductive traces to interconnect the circuit elements formed on the substrate and to connect the contact pads of one or more integrated circuits that are mounted on the substrate. These circuit elements are used to form antennas, tuning capacitors, and coupling capacitors of resonant circuits external to the integrated circuit. A conductivity layer is formed and patterned on a substrate, substrate comprising paper, sheets of plastic, polypropylene, polyolefin, or like materials. A dielectric layer is formed on top of the conductive layer. In one embodiment, openings through the dielectric layer to the conductive layer are formed in regions where contact to the conductive layer is desired. In another embodiment, no openings are made in the dielectric layer. The integrated circuit is then adhered to the substrate, either on the dielectric layer or in an opening making, contact with the conductivity layer, depending on the electrical connections desired. A portion of the substrate is then folded onto itself so that contact points on one side of the fold will align with contact points on the other side of the fold or to contact pads on the integrated circuit, thereby electrically coupling the aligned contact points. In addition, a capacitor circuit element is formed when two conductive regions on the substrate covered with the dielectric layer align when a portion of the substrate is folded onto itself. Alternatively, the folded portion of the substrate and the unfolded portion of the substrate could be cut apart rather than folded, or the two portions could be produced separately.

DESCRIPTION OF THE DRAWINGS

FIG. 26 is a top view illustrating the conductive pattern to form the circuit of FIG. 22 utilizing an integrated circuit with two terminals on the front surface. Dimensions of the components are exaggerated for clarity of illustration.

DETAILED DESCRIPTION OF THE INVENTION

The electrical circuit of the present invention is illustrated by specific embodiments, along with methods for forming the electrical circuits.

One embodiment provides a method for producing an RFID tag utilizing an integrated circuit that is designed to require an external connection of the first and second terminal of an inductor coil antenna, first terminal coupling to the back surface of the integrated circuit and second terminal to a pad on the front surface of the integrated circuit.

Figure 1:
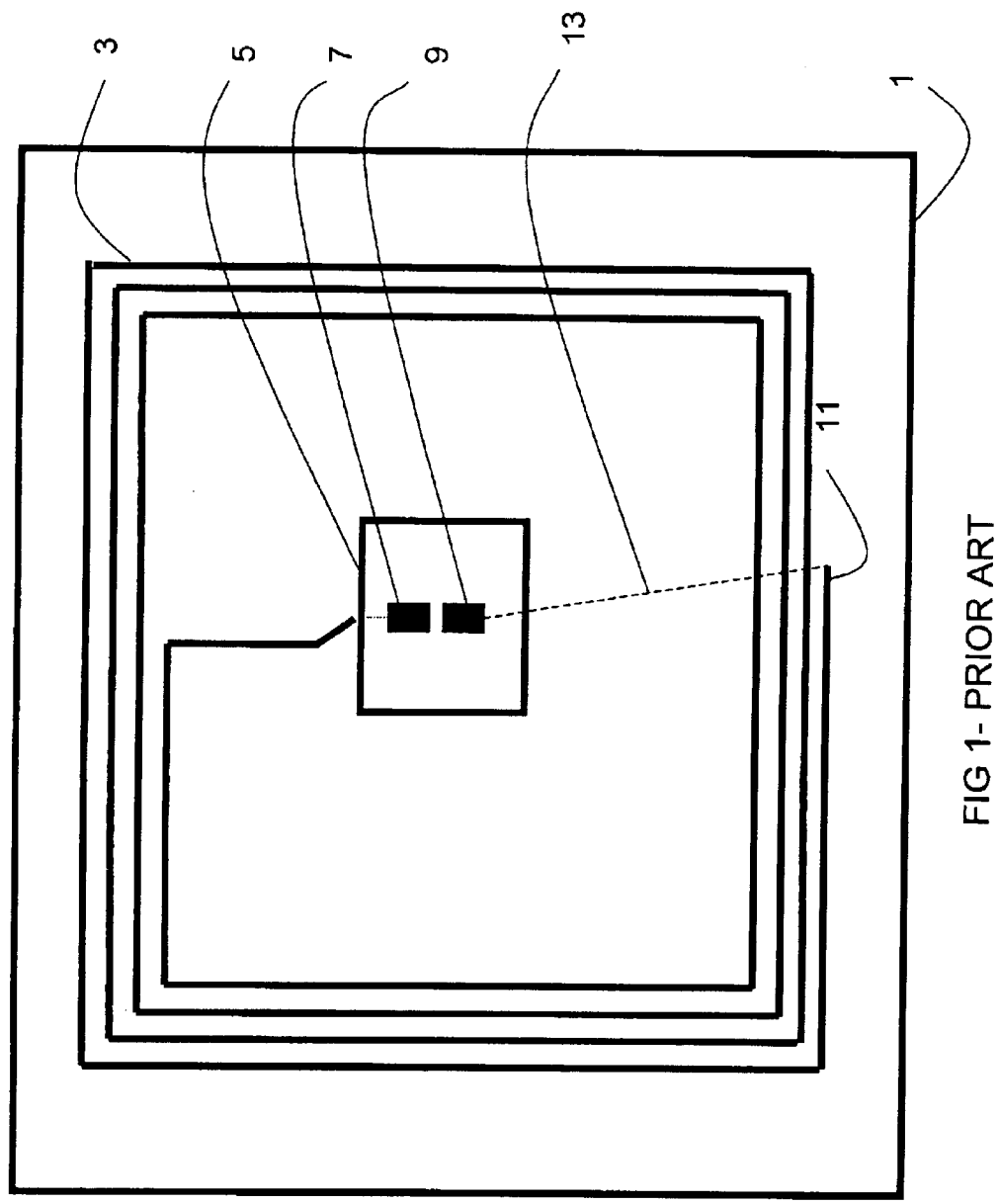
FIG. 1 is a top view drawing showing a prior art structure of a conventional RFID tag on flexible substrate with the dimensions of the components exaggerated for clarity of illustration.
Figure 2:
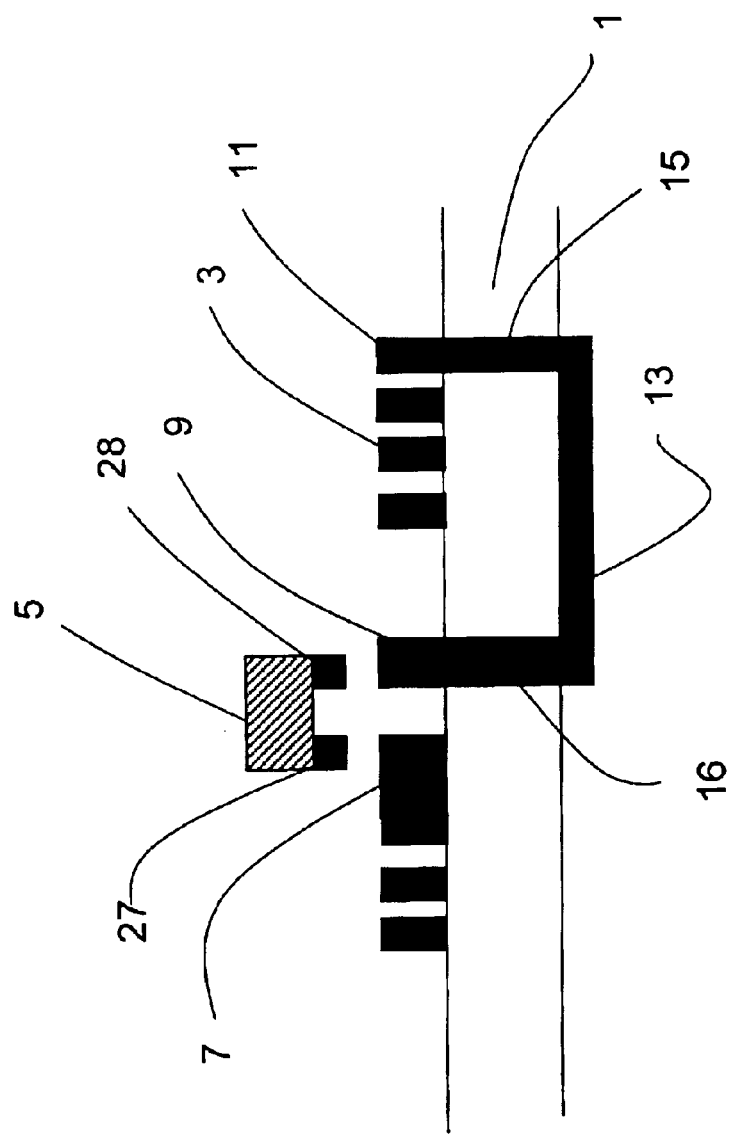
FIG. 2 is a cross sectional drawing showing a prior art structure of a conventional RFID tag on flexible substrate wherein conductive layers are printed on top and bottom surfaces of the substrate with the dimensions of the components exaggerated for clarity of illustration.
Figure 3:
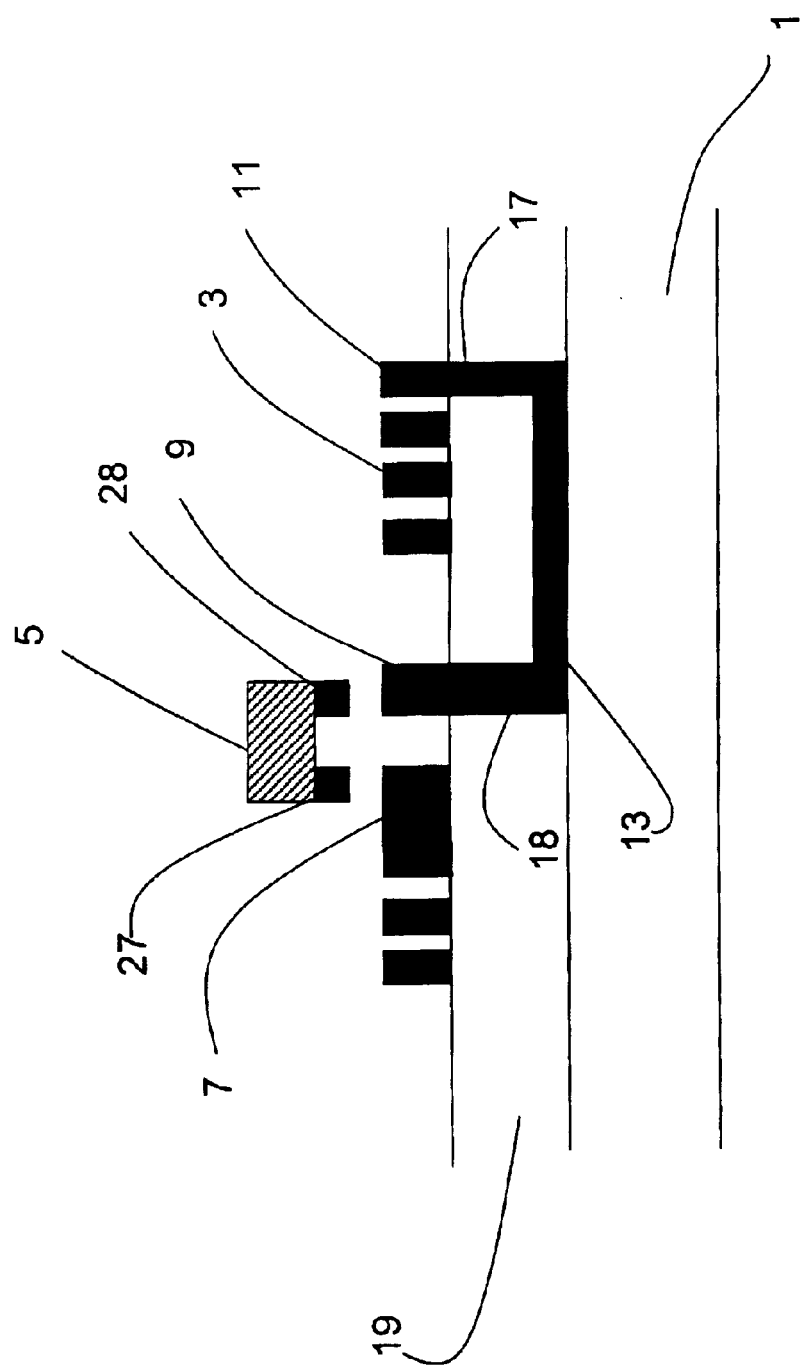
FIG. 3 is across sectional drawing showing a prior art structure of a conventional RFID tag on flexible substrate wherein two conductive layers are printed on top surface of the substrate with the dimensions of the components exaggerated for clarity of illustration.
Figure 4:
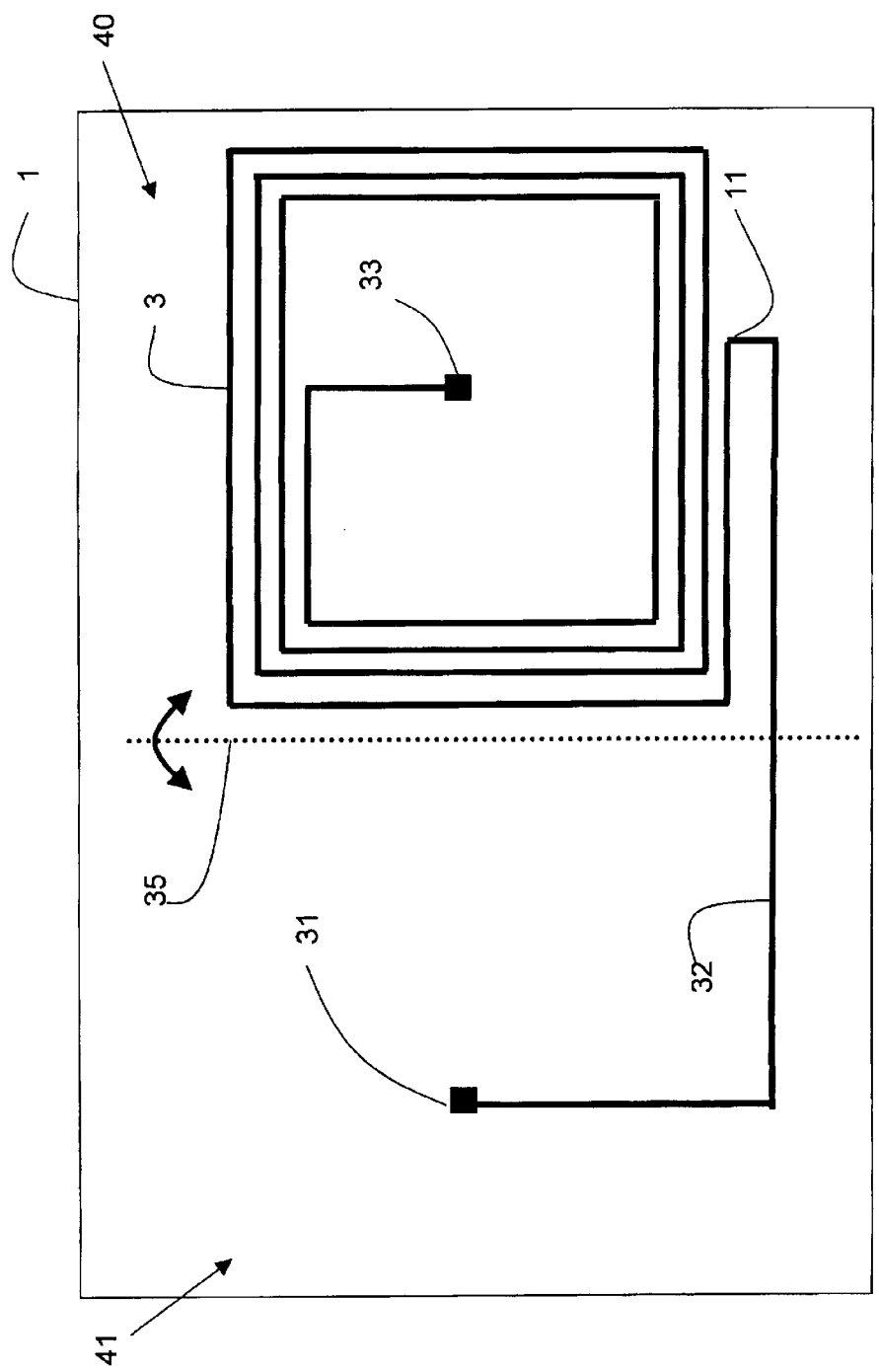
FIG. 4 is a top view drawing of one embodiment of the present invention utilizing an integrated circuit requiring that first terminal of the antenna is coupled to the back surface of the chip and second terminal is coupled to a pad on the integrated circuit. Dimensions of the components are exaggerated for clarity of illustration.

FIG. 4 is a top view diagram illustrating this embodiment of the present invention. A conductive layer is formed and patterned on unitary substrate 1. Such patterning can be achieved utilizing any of a variety of methods including printing with conductive ink such as polymer ink with silver particles, chemically etching a deposited conductive layer, or stamping of a suitable conductive foil and adhering the stamped foil to unitary substrate 1.

In describing the pattern of the conductive layer, it is useful to figuratively divide unitary substrate 1 into two portions around a fold line 35, forming second substrate 40 and first substrate 41. Inductor coil 3 is formed on second substrate 40. In the center of inductor coil 3 is a conductive region forming the substrate contact pad 33, a contact to the inner terminal of inductor coil 3. On first substrate 41, another conductive region forms substrate contact pad 31. Substrate contact 31 is connected to the outer terminal 11 of inductor coil 3 with conductor trace 32.

The back surface of the integrated circuit is now attached on top of substrate pad 33, thereby making electrical contact between substrate pad 33 and the back surface of the integrated circuit. Such attachment could be accomplished with a number of techniques including the use of conductive adhesive.

Figure 5:
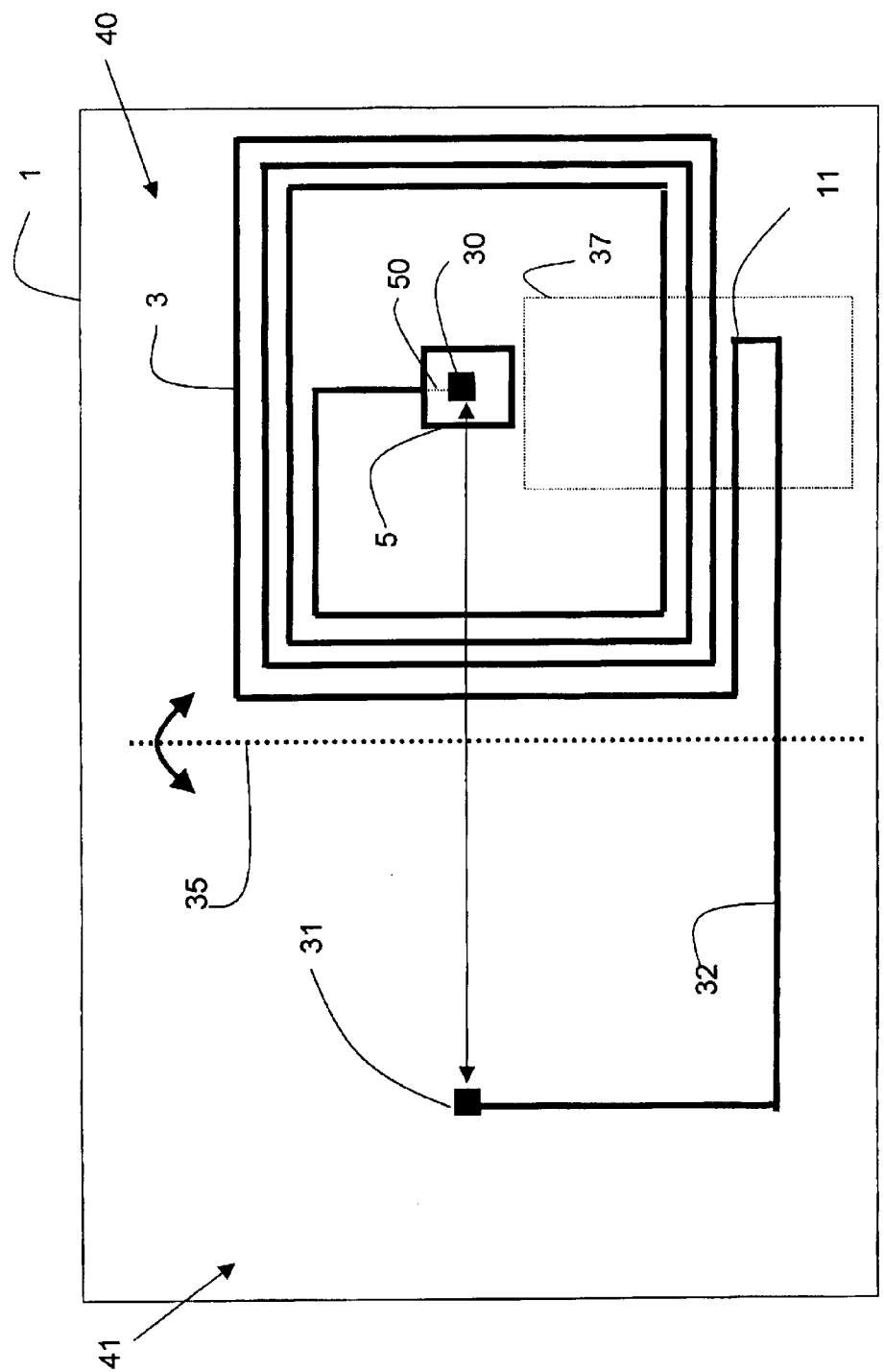
FIG. 5 is a top view drawing associated with FIG. 4 at a step after the integrated circuit is mounted on the substrate. Dimensions of the components are exaggerated for clarity of illustration.

FIG. 5 is a top view of the structure after integrated circuit 5 is placed. A conductive trace 50 connecting the inner terminal of inductor coil 3 to substrate contact 33 is now underneath integrated circuit 5, making electrical contact to the back surface of integrated circuit 5. Integrated circuit pad 30 on integrated circuit 5 is now visible in the top view presented in FIG. 5.

A dielectric layer is now formed on top of the conductive layer such that if unitary substrate 1 were folded about fold line 35, no electrical connection is formed between the conductors that fold onto each other except substrate pad 31 and integrated circuit pad 30. In the case of this embodiment, this can be achieved by forming a dielectric layer in the area marked 37 of FIG. 5. This dielectric region serves only to avoid an electrical connection between conductive trace 32 on first substrate 41 and inductor coil 3 on the second substrate 40. As such, this dielectric region is not subjected to tight alignment tolerances. Further, this dielectric region is not subjected to tight thickness requirements. As long as the dielectric region electrically isolates the conductors on the top and bottom of the dielectric region, this dielectric region is not subjected to tight quality requirements either. Such standards could be achieved at very low cost, such as by applying tape made of dielectric material over region 37 of FIG. 5.

Figure 6:
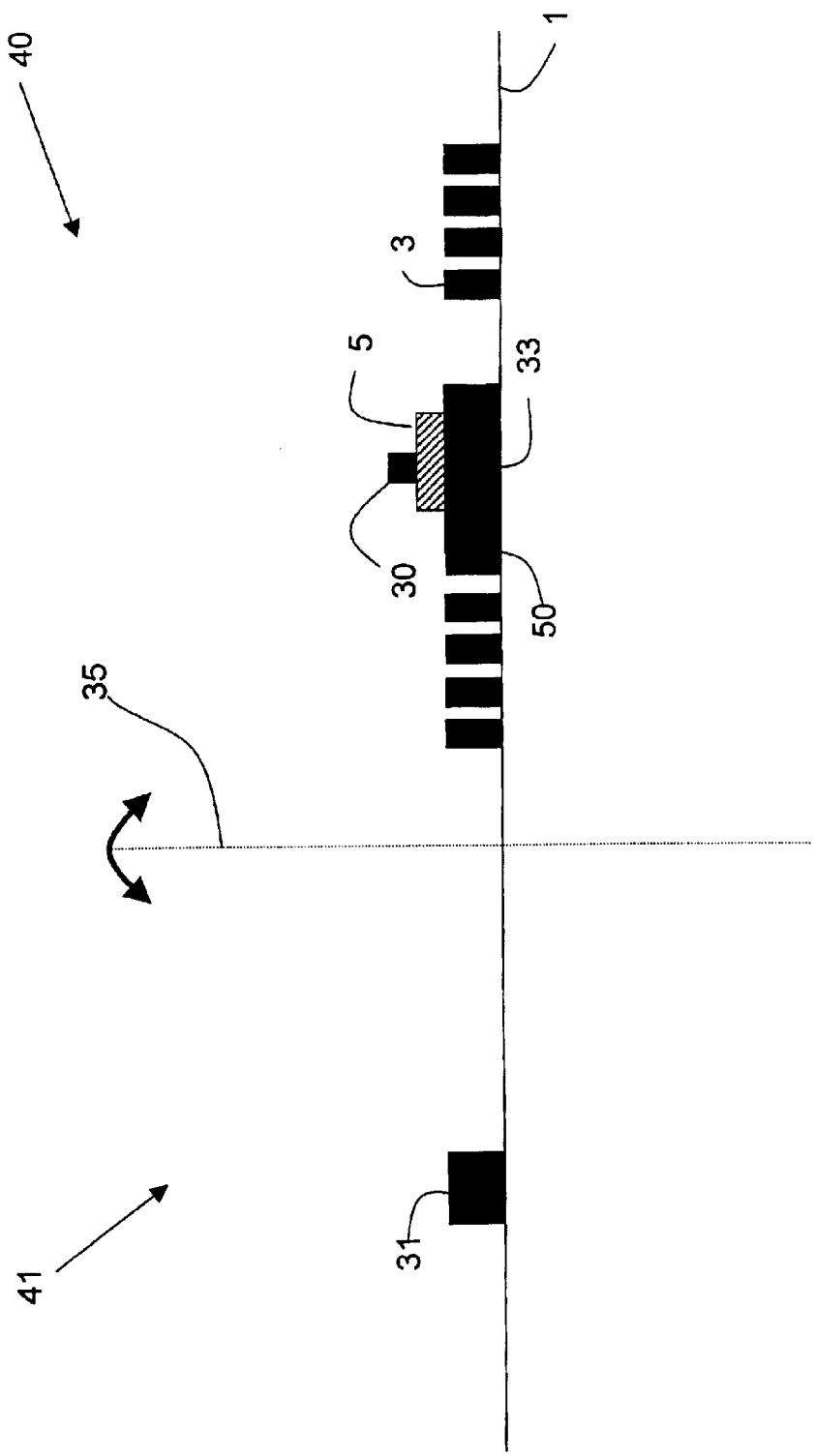
FIG. 6 is an illustration of the structure in FIG. 5 from a cross sectional view. Dimensions of the components are exaggerated for clarity of illustration.

FIG. 6 is a cross sectional view of the above-described structure, like numbers indicating like elements. Conductive adhesive is applied to either the surface of substrate contact 31 or the contact pad 30 of integrated circuit 5. Unitary substrate 1 is now folded around fold line 35. Integrated circuit contact pad 30 on second substrate 40 aligns with substrate contact 31 on first substrate 41, thereby making electrical contact between substrate contact 31 and integrated circuit contact 30.

Figure 7:
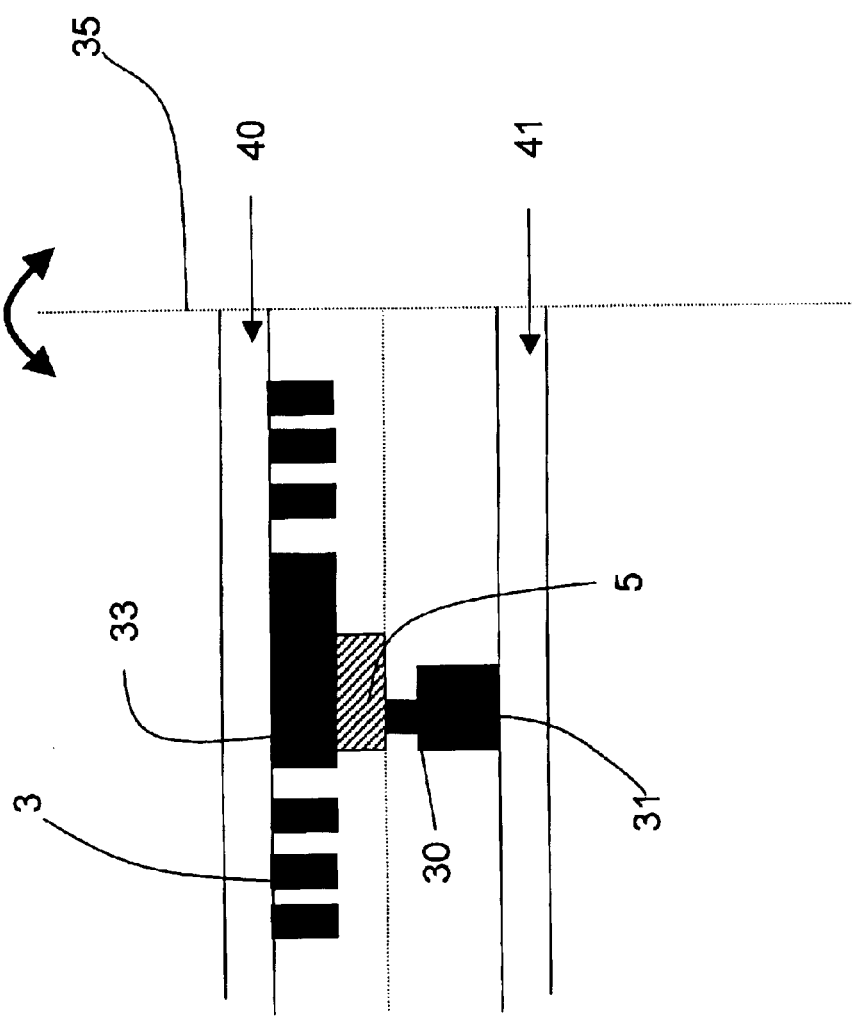
FIG. 7 is a cross sectional drawing of the structure of FIG. 6 after a portion of the substrate is folded on to itself. Dimensions of the components are exaggerated for clarity of illustration.

FIG. 7 illustrates a cross section of the resulting structure. Second substrate 40 is now upside down on top of first substrate 41. Since substrate contact 31 is coupled to the outer terminal 11 of inductor coil 3 and since substrate contact 33 is coupled to the back surface of integrate circuit 5, the inner and outer terminals of antenna coil 3 are coupled to respective contacts on integrated circuit 5.

In order to reduce the alignment tolerance required to align integrated circuit pad 30 with substrate pad 31, integrated circuit pad 30 on integrated circuit 5 could be enlarged utilizing a layer of metal covering the surface of integrated circuit 5, in whole or part, that is electrically insulated from all other conductors on the integrated circuit, and coupling that metal layer to integrated circuit pad 30. Though this surface may not be suitable for some conventional bonding techniques, such as ball bonding, due to possible damage that may result on the structures below and in the vicinity of the contact point, this surface is suitable for the type of bonding technique appropriate in this embodiment, such as conductive adhesive.

In an alternative to this embodiment, integrated circuit 5 can be mounted upside down onto pad 31 of first substrate 41 instead of mounting the integrated circuit right side up on pad 33 on the second substrate 40. When first substrate 41 and second substrate 40 are folded onto each other, pad 33 on second substrate 40 will align with the back surface of integrated circuit 5. This method has the benefit of a lower required alignment tolerance when folding the substrate than if bond pad 30 of integrated circuit 5 needs to align with contact pad 31.

An alternative to this embodiment provides for a method of forming a high quality dielectric layer. After the back surface of integrated circuit 5 is adhered to substrate pad 33, a dielectric layer is formed, thereby covering the conductive layer on unitary substrate 1 and integrated circuit 5 mounted on unitary substrate 1. Now openings in the dielectric are formed on substrate pad 33 and integrated circuit pad 30. Second substrate 40 is then folded onto first substrate 41, thereby making electrical contact between substrate pad 31 and integrated circuit pad 30.

An alternative to this embodiment provides a method for enlarging the size of integrated circuit pad 30 using a second conductive layer on unitary substrate 1. After the back surface of integrated circuit 5 is adhered to substrate pad 33, a dielectric layer is formed, thereby covering the conductive layer on unitary substrate 1 and integrated circuit 5 mounted on unitary substrate 1. Now openings in the dielectric are formed on substrate pad 31 and integrated circuit pad 30. A second conductive layer is now formed that is electrically insulated from all conductive traces on unitary substrate 1 by the, dielectric, but is coupled to integrated circuit pad 30 via the opening in the dielectric.

Second substrate 40 is then folded onto first substrate 41, thereby making electrical contact between substrate pad 31 and integrated circuit pad 30.

Another alternative to this embodiment provides for another method of forming a high quality dielectric layer. Before integrated circuit 5 is placed on unitary substrate 1, a dielectric layer is formed on the conductive layer. Openings in the dielectric are formed on substrate contact 33 and substrate contact 31. Integrated circuit 5 is now adhered to substrate contact 33 through the opening in the dielectric, thereby making electrical contact between substrate contact 33 and the back surface of integrated circuit 5. Second substrate 40 is then folded onto first substrate 41, thereby making electrical contact between substrate pad 31 and integrated circuit pad 30.

Another alternative to this embodiment is to produce second substrate 40 and first substrate 41 independently by the methods above described, and then to adhere the surface of second substrate 40 to the surface of first substrate 41.

Figure 8:
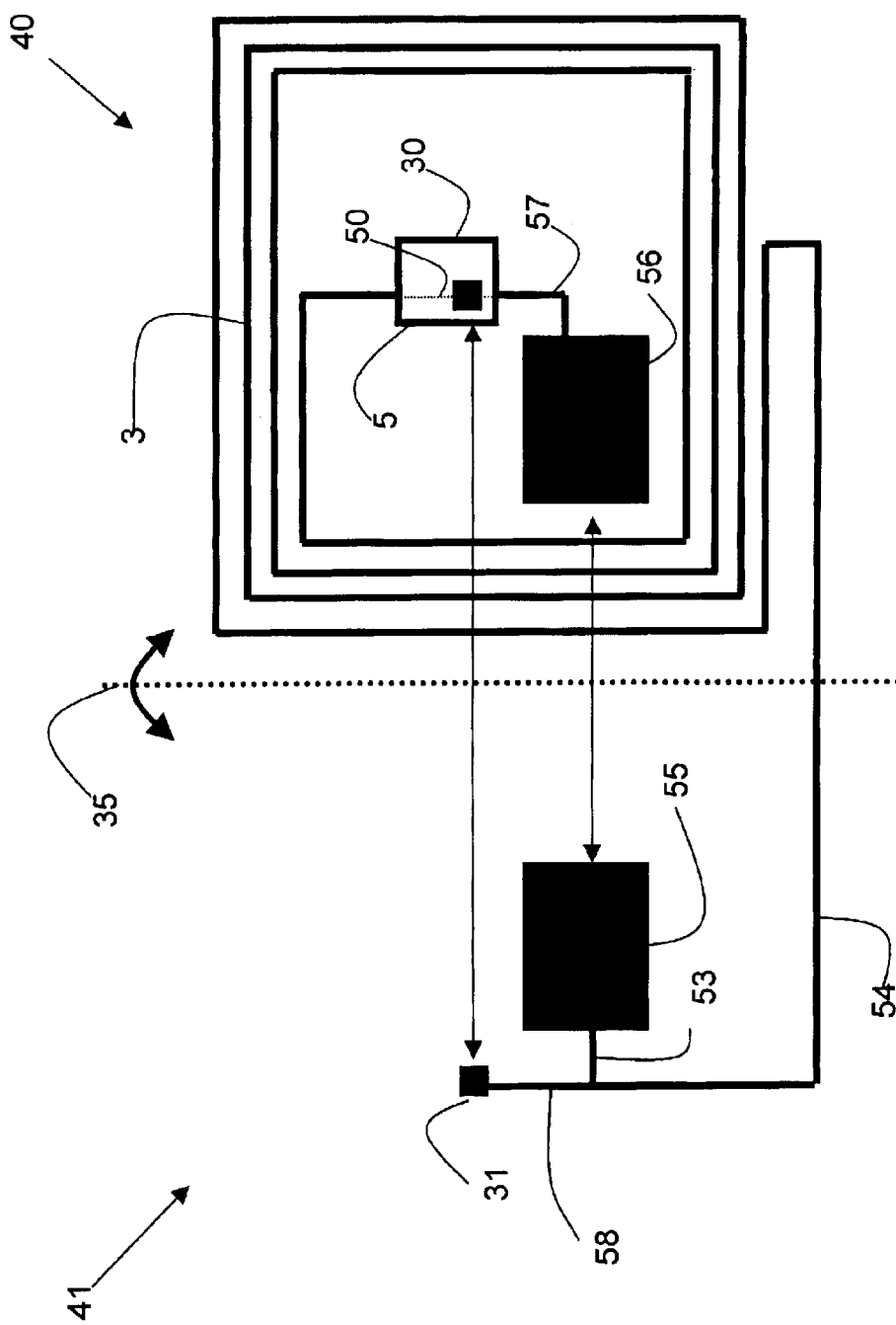
FIG. 8 is a top view drawing of one embodiment with capacitor circuit components formed on the substrate. Dimensions of the components are exaggerated for clarity of illustration.

FIG. 8 illustrates of another variation of this embodiment wherein a capacitor circuit element is also produced utilizing the methods disclosed in the present invention. Utilizing one of the methods described above, integrated circuit 5 is adhered on substrate contact 33, thereby making electrical contact with the back surface of integrated circuit 5. Integrated circuit pad 30 is now visible in the top view presented in FIG. 8. Substrate contact 31 is placed so that if unitary substrate 1 is folded around fold line 35, the substrate contact 31 and integrated circuit pad 30 align. In addition, a conductive region 56 is formed on second substrate 40, electrically coupled to the inner terminal of inductor coil 3 and to the back surface of integrated circuit 5 via conductive trace 57. A corresponding conductive region 55 is formed on first substrate 41 placed so that if unitary substrate 1 were folded around fold line 35, conductive regions 55 and 56 would align. Conductive region 55 is electrically coupled to the substrate pad 31 via conductive trace 58 and 53 and to the outer terminal of inductor coil 3 via conductive trace 58 and 54. No openings are formed in the dielectric on conductive regions 55 and 56.

Figure 9:
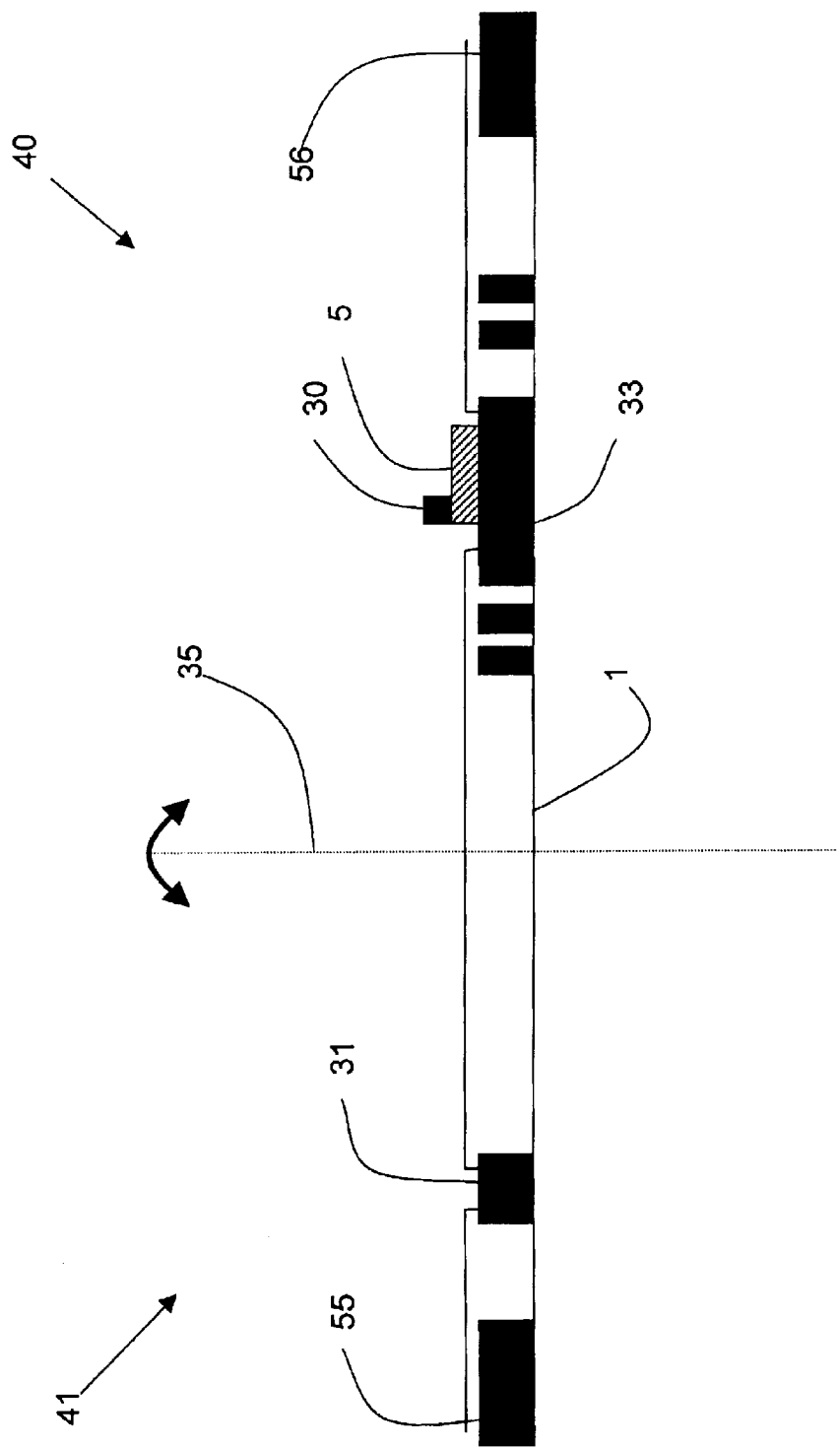
FIG. 9 is a cross sectional view of the structure in FIG. 8. Dimensions of the components are exaggerated for clarity of illustration.

FIG. 9 is a cross sectional drawing of the resulting structure.

Figure 10:
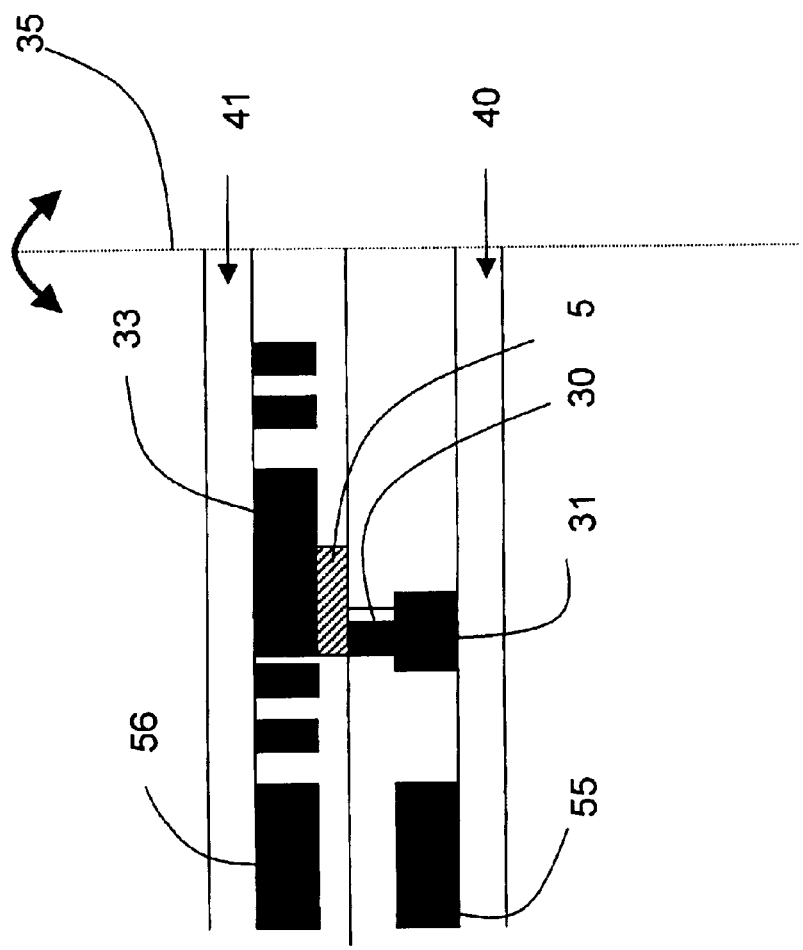
FIG. 10 is a cross sectional view of the structure in FIG. 9 after a portion of the substrate is folded onto itself, showing the formation of a capacitor circuit element. Dimensions of the components are exaggerated for clarity of illustration.

FIG. 10 is a cross sectional drawing when unitary substrate 1 is folding around fold line 35. A capacitor is now formed between conductive region 56 and conductive region 55, separated by the dielectric layer on top of the conductive region 56 and the dielectric layer on conductive region 55.

In a variation of this embodiment, a dielectric opening could be made over conductive region 56 or conductive region 55, then forming a capacitor with one half of the dielectric thickness.

An alternative embodiment provides a method for producing an RFID tag utilizing an integrated circuit that is designed to require an external connection of first and second terminal of an inductor coil antenna, first and second terminals coupling to two pads on the front surface of the integrated circuit.

Figure 11:
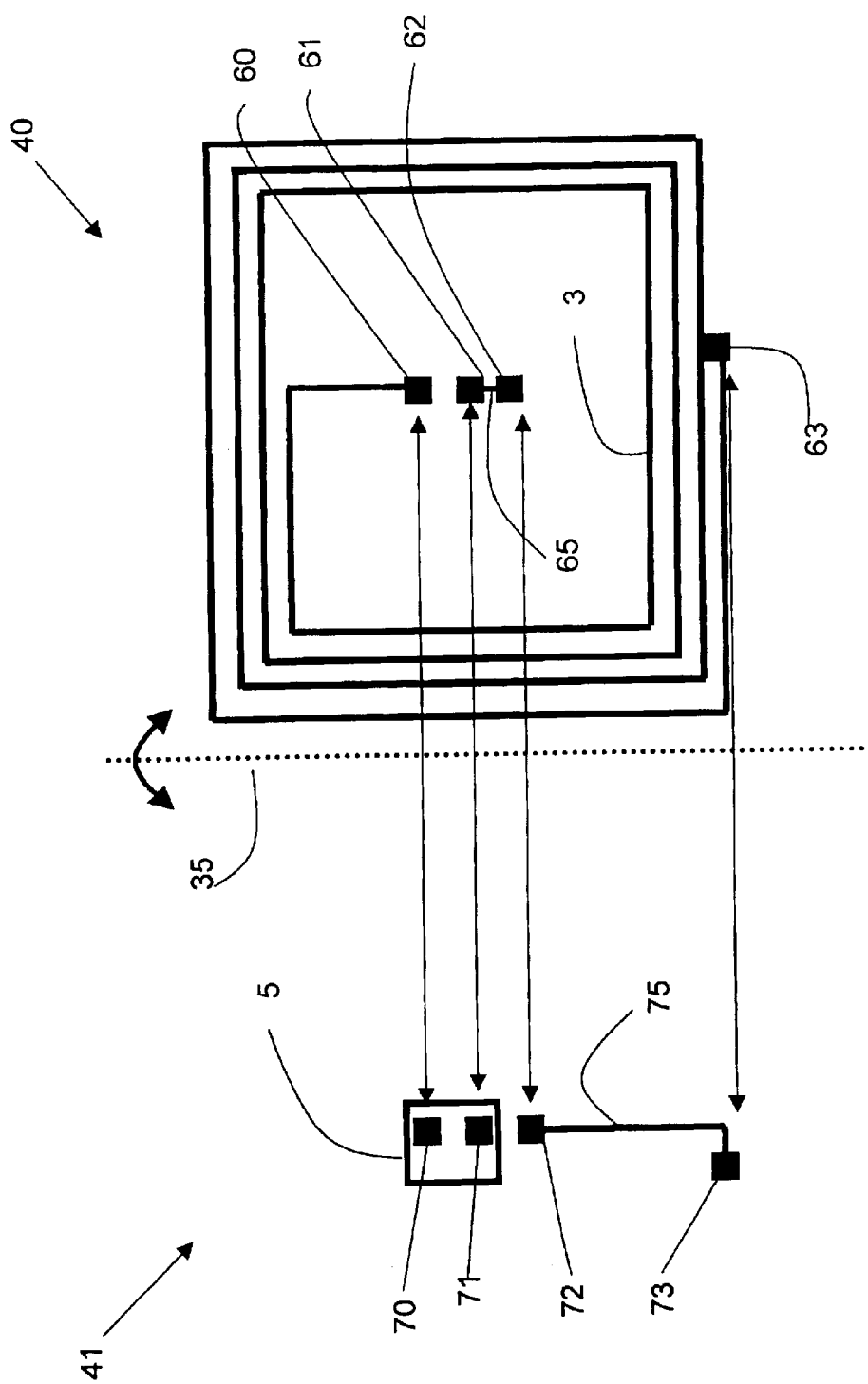
FIG. 11 is a top view drawing of an alternative embodiment utilizing an integrated circuit requiring that first and second terminals of the antenna are coupled to first and second pad on the surface of the integrated circuit. Dimensions of the components are exaggerated for clarity of illustration.

FIG. 11 illustrates a top view drawing of this embodiment. Coil inductor 3 is formed on second substrate 40 with substrate contact 60 connecting to the inner terminal and substrate contact 63 to the outer terminal. In addition, substrate contact 61 and 62 are placed inside coil inductor 3. On first substrate 41, integrated circuit 5 is adhered to the dielectric layer, and placed such that integrated circuit pads 70 and 71 would align with substrate contact 60 and substrate contact 61, respectively, if unitary substrate 1 were folded about fold line 35. Further, substrate contacts 72 and 73 are placed on the first substrate 41 such that substrate contacts 62 and 63 would align with substrate contacts 72 and 73, respectively, if unitary substrate 1 were folded about fold line 35.

Now unitary substrate 1 is folded about fold line 35, thereby coupling substrate contact 60 to integrated circuit pad 70, substrate contact 61 to integrated circuit pad 71, substrate contact 62 to substrate contact 72, and substrate contact 63 to substrate contact 73. Consequently, integrated pad 70 is connected to inner terminal 60 of coil inductor 3. Outer terminal 63 of coil inductor 3 couples to integrated circuit pad 71 through a sequence of connections, specifically outer terminal 63 of coil inductor 3 couples with substrate contact 73, which in turn is coupled to substrate contact 73 via conductor trace 75, which in turn is coupled to substrate contact 62, which in turn is coupled to substrate contact 61 via conductor trace 65, which in turn is coupled to integrated circuit pad 71.

Figure 12:
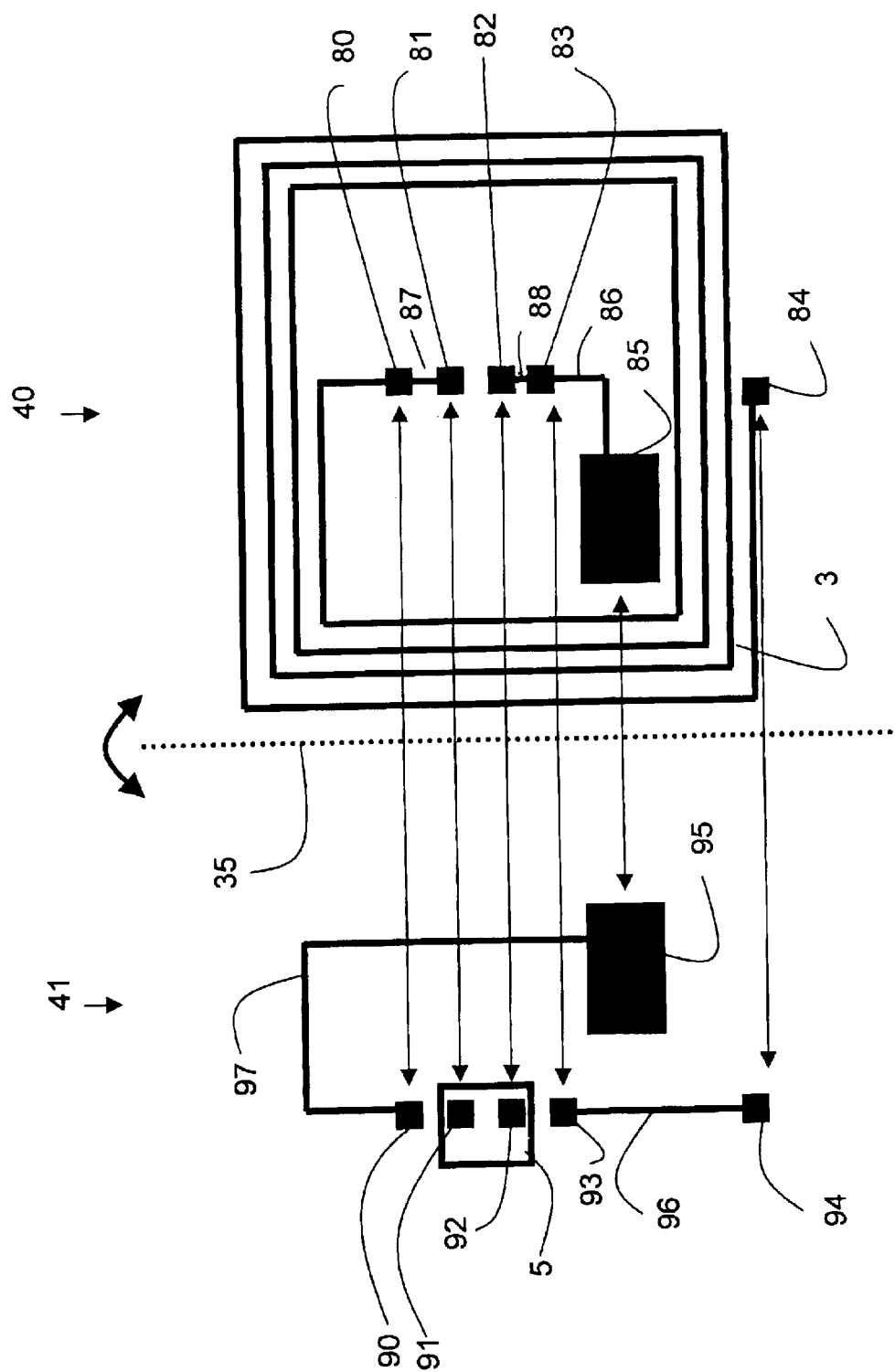
FIG. 12 is a top view drawing of the embodiment shown in FIG. 11 wherein capacitor circuit elements are formed. Dimensions of the components are exaggerated for clarity of illustration.

FIG. 12 illustrates a variation of this embodiment wherein capacitor circuit elements are also produced utilizing the methods disclosed in the present invention.

Coil inductor 3 is formed on second substrate 40, substrate contact pad 80 and substrate contact 81 placed on the inner terminal and substrate contact 84 placed on the outer terminal. Substrate contact 82 and 83 are placed inside the inner loop of coil inductor 3, coupled by conductor trace 88. Substrate contact 84 is coupled to conductive region 85 via conductor trace 86.

Substrate contact 90, 93, and 94 are placed on substrate left 41 such that if unitary substrate 1 were folded about fold line 35, these contacts would align with substrate contacts 80, 83, and 84, respectively. Integrated circuit 5 is adhered to the dielectric layer in first substrate 41 such that integrated circuit pads 91 and 92 would align with substrate contacts 81 and 82 if unitary substrate 1 were folded about fold line 35. Substrate contact 94 is coupled to substrate contact 93 via conductor trace 96. Substrate contact 90 is coupled to a conductive region 95 via conductor trace 97. Conductive region 95 is placed on first substrate 41 such that it would align with conductive region 85 if unitary substrate 1 were folded about fold line 35. Dielectric openings are made on substrate contacts 80, 81, 82, 83, 84, 90, 93, 94, and integrated circuit pads 91 and 92. No dielectric openings are made in conductive regions 85 and 95.

Now unitary substrate 1 is folded about fold line 35, thereby coupling substrate contact 80 to substrate contact 90, substrate contract 81 to integrated circuit pad 91, substrate pad 82 to integrated circuit pad 92, substrate contact 83 to substrate contact 93, and substrate contact 84 to substrate contact 94. Conductive regions 85 and 95 align, but are separated by the dielectric covering the conductive regions, thereby forming a capacitor with electrodes 85 and 86, separated by the dielectric covering those conductive regions.

Integrated circuit pad 91 is, now coupled to the inner terminal of coil inductor 3 by coupling to substrate pad 81. Integrated circuit pad 91 is also coupled to the bottom electrode 95 of the capacitor by a series of connections, specifically integrated circuit pad 91 couples to substrate contact 81, which in turn is coupled to substrate contact 80 via conductor trace 87, which in turn in coupled to substrate contact 90, which in turn is connected to conductive region 95 via conductor trace 97.

Integrated circuit pad 92 is now coupled to the outer terminal 84 of coil inductor 3 by a series of connections, specifically integrated circuit pad 92 couples to substrate contact 82, which in turn couples to substrate contact pad 83 via conductive trace 88, which in turn couples to substrate contact 93, which turn couples to contact pad 94 via conductive trace 96, which in turn couples to the outside terminal of inductor coil 3, substrate contact 84. Integrated circuit pad 92 is also coupled to the top electrode 85 of the capacitor through a series of connections, specifically integrated circuit pad 92 is coupled to substrate contact 82, which in turn is coupled to substrate contact 83 via conductor trace 88, which in turn is coupled to the top electrode 85 of the capacitor.

Therefore, integrated circuit pad 91 is now coupled to the inner terminal of coil inductor 3 and bottom electrode 95 of the capacitor. Integrated circuit pad 92 is now coupled to the outer terminal of coil inductor 3 and the top electrode of the capacitor 85.

A variation of this embodiment provides a method of producing a capacitor circuit element having twice the capacitance by forming an opening on either conductive region 85 or 95. When unitary substrate 1 is folded about fold line 35, the dielectric thickness separating electrode 85 and 95 is one half the thickness when compared to having no openings in the dielectric on conductive regions 85 and 95, thereby providing twice the capacitance.

Figure 13:
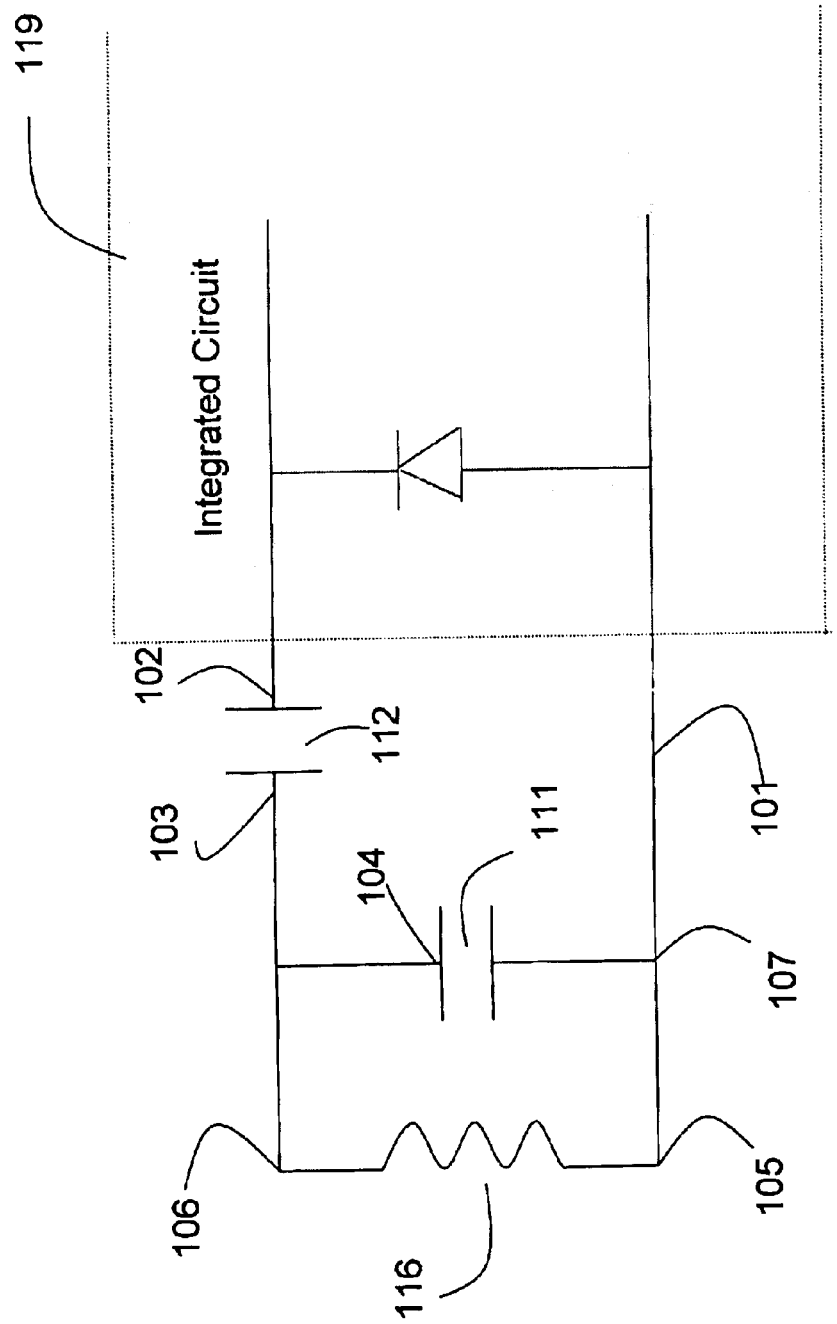
FIG. 13 is a schematic diagram of another embodiment of the present invention.

FIG. 13 is a schematic diagram illustrating another embodiment wherein an external antenna inductor 116, a tuning capacitor 111, and a coupling capacitor 112 are produced on the substrate and are connected to an RFID integrated circuit without making openings in the dielectric layer. Circuitry 119 resides on the integrated circuit.

Figure 14:
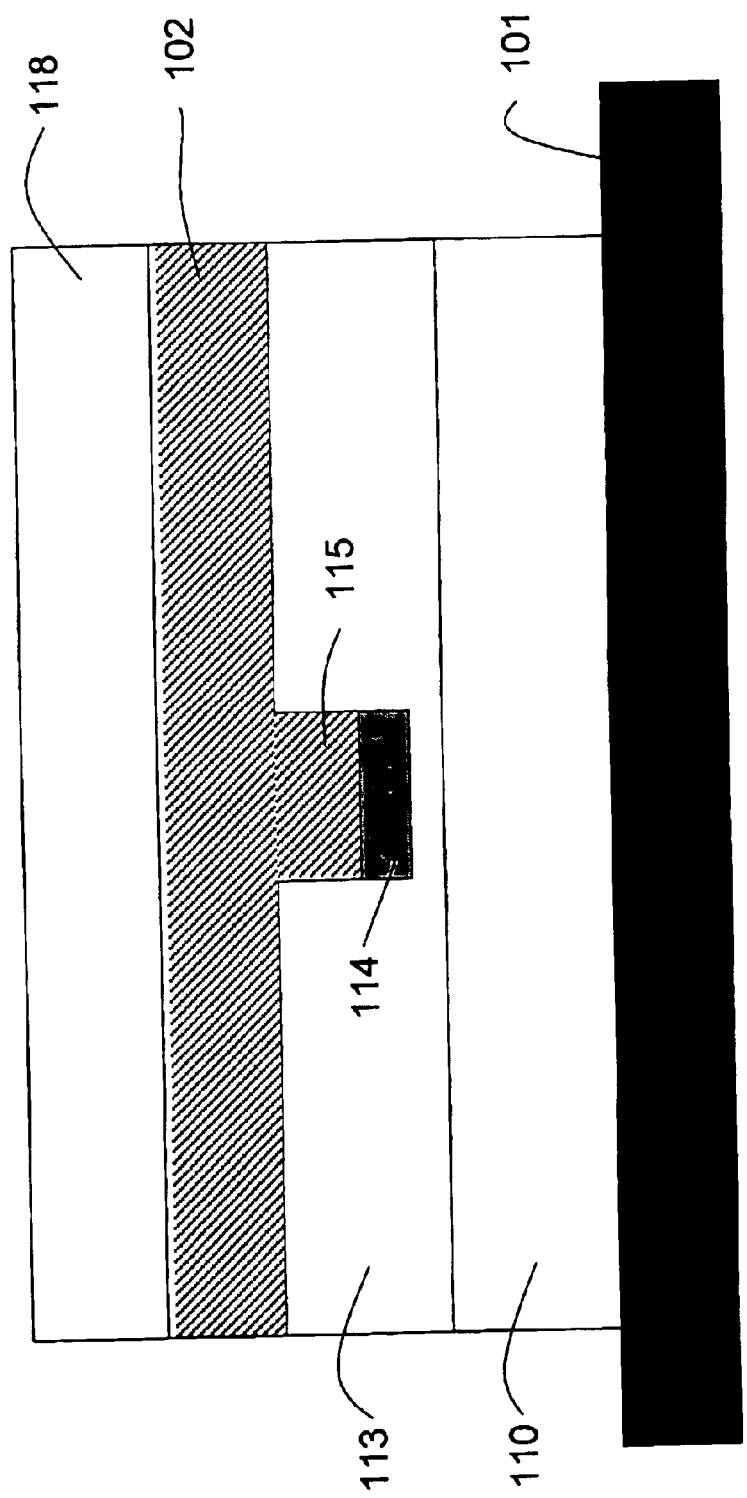
FIG. 14 is a cross sectional diagram illustrating the mounting of the integrated circuit to form the circuit of FIG. 13. Dimensions of the components are exaggerated for clarity of illustration.

FIG. 14 is a cross sectional diagram illustrating the mounting of the integrated circuit in this embodiment. The integrated circuit has a first terminal 110 on the back surface and a second terminal 102 on the front surface. Second terminal 102 comprises a metal layer on the front surface of the integrated circuit overlying inter-dielectric 113 on the integrated circuit, making contact with underlying conductive layer 114 via opening 115 in inter-dielectric 113. The integrated circuit is mounted with conductive adhesive onto substrate contact 101, first terminal 110 of the integrated circuit thereby coupled to substrate contact 101. A dielectric layer 118 is then formed over the integrated circuit and the conductive pattern formed on the substrate. No openings are made in dielectric layer 118.

Figure 15:
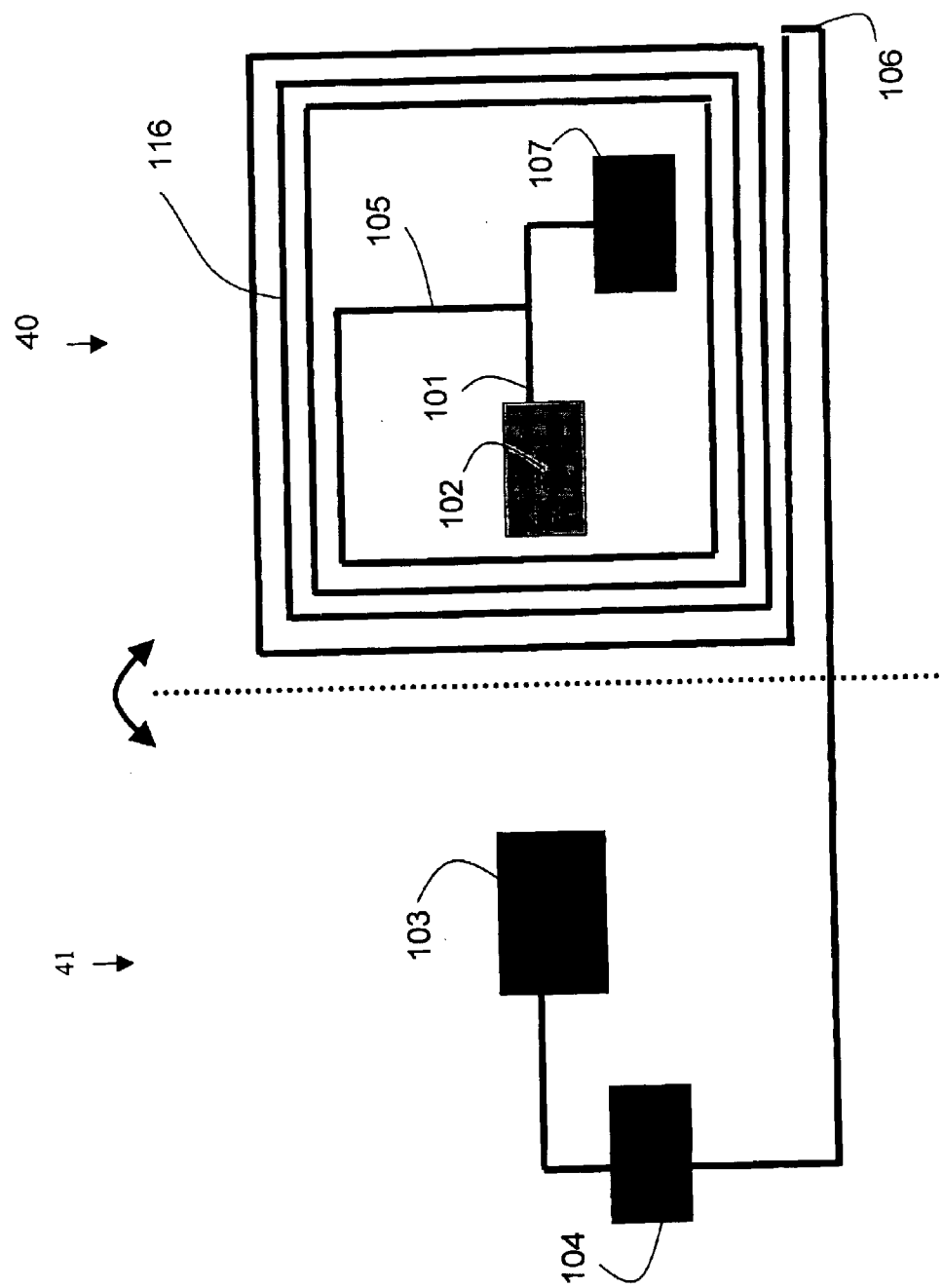
FIG. 15 is a top view illustrating the conductive pattern to form the circuit of FIG. 13. Dimensions of the components are exaggerated for clarity of illustration.

FIG. 15 is a top view illustrating the conductive pattern formed on the substrate to form the circuit elements of FIG. 13, like structures having like numbers. In the planar view, second terminal 102 of the integrated circuit is visible. Underneath the integrated circuit is substrate pad 101 to which first terminal 110 of the integrated circuit is coupled. When first substrate 41 is folded onto second substrate 40, second terminal 162 of the integrated circuit forms one plate of coupling capacitor 112. Substrate pad 103 forms the other plate of capacitor 112. Substrate pad 103 is coupled to substrate pad 104, forming one plate of capacitor 111, the other plate being formed by substrate pad 107, which is coupled to substrate pad 101 which is in turn coupled to first terminal 110 of the integrated circuit. Substrate pad 103 is also coupled to the outside terminal 106 of the antenna inductor 116. The inside terminal 105 of antenna inductor 116 is coupled to substrate pad 101 which is in turn coupled to the first terminal 110 of the integrated circuit. The circuit illustrated in FIG. 13 is thereby formed.

One advantage of this embodiment is that no openings are made in the dielectric overlying the integrated circuit and the conductive layer on the substrate, thereby providing significant cost savings.

Another advantage of this embodiment is first substrate 41 and second substrate 40 can be folded on top of each other with non-critical alignment tolerance requirements. Substrate pad 103 can be made larger than conductive layer 102 on the integrated circuit to further reduce alignment tolerance requirements. Similarly, substrate pad 104 can be made larger than unitary substrate 107 to further reduce alignment tolerance requirements. Such looser alignment tolerance requirements increase yield and reduce production costs.

Figure 16:
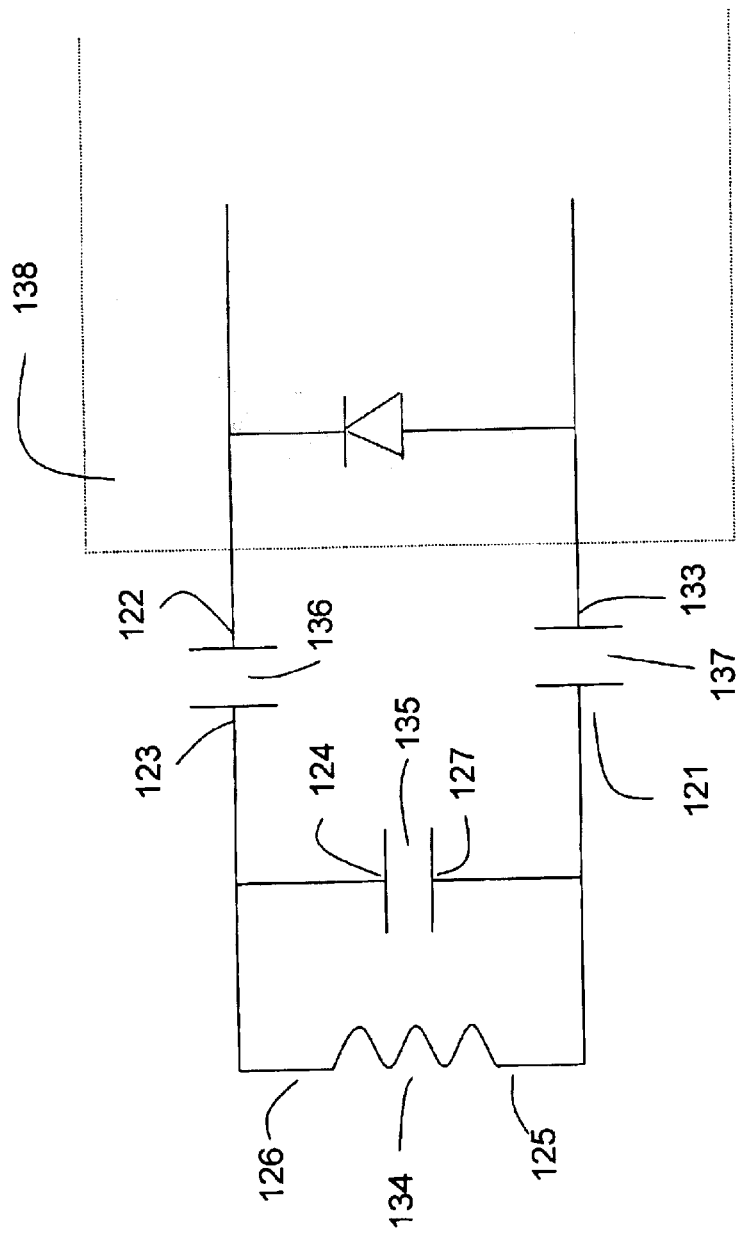
FIG. 16 is a schematic diagram of another embodiment of the present invention.

FIG. 16 is a schematic diagram illustrating another embodiment wherein an external antenna inductor 134, a tuning capacitor 135, a top coupling capacitor 136 and a bottom coupling capacitor 137 are produced on the substrate and are connected to an RFID integrated circuit without making openings in the dielectric layer. Circuitry 138 resides on the integrated circuit.

Figure 17:
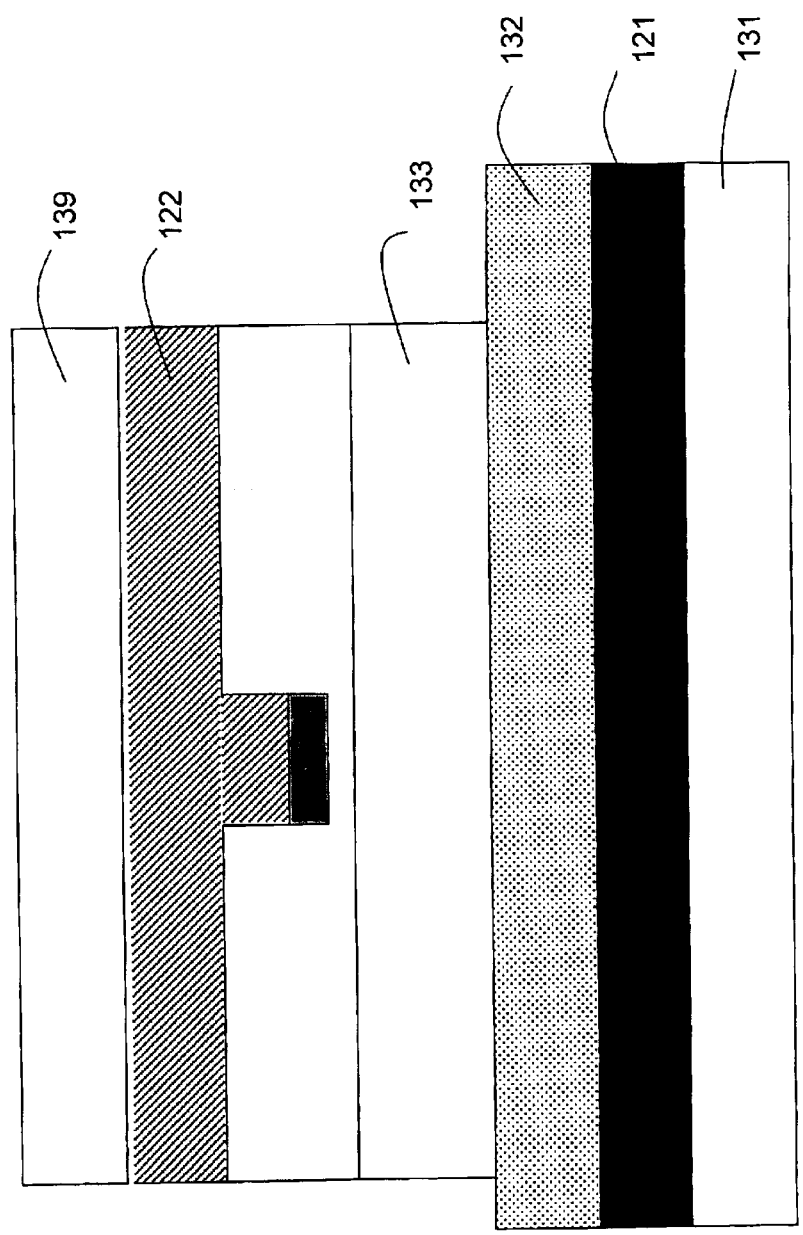
FIG. 17 is a cross sectional diagram illustrating the mounting, of the integrated circuit to form the circuit of FIG. 16. Dimensions of the components are exaggerated for clarity of illustration.

FIG. 17 is a cross sectional diagram illustrating the mounting of the integrated circuit in this embodiment. A conductive layer is deposited on the surface of unitary substrate 131, and is then patterned and etched. A dielectric layer 132 is formed on top of conductive layer 121. The integrated circuit is mounted on top of dielectric layer 132. The integrated circuit has a first terminal 133 on the back surface and a second terminal 122 on the front surface. Second terminal 122 comprises a metal layer on the front surface of the integrated circuit overlying an inter-dielectric layer on the integrated circuit, making contact to conductive layers below utilizing appropriate openings in the inter-dielectric layer on the integrated circuit. In one embodiment, a dielectric layer 139 is formed on the front surface of the integrated circuit. In another embodiment, dielectric layer 139 is not formed. No openings are made in dielectric layer 132.

Figure 18:
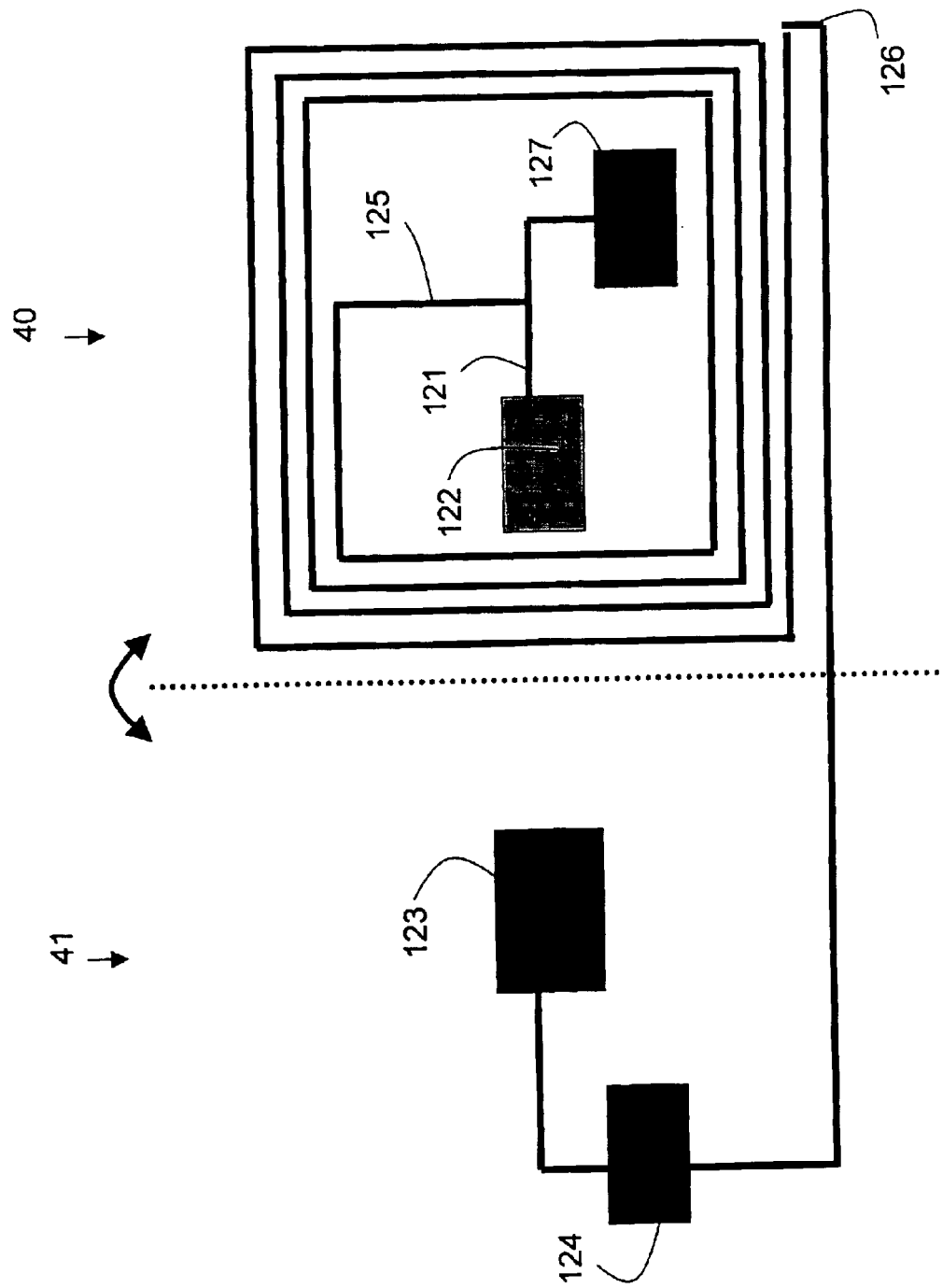
FIG. 18 is a top view illustrating the conductive pattern to form the circuit of FIG. 16. Dimensions of the components are exaggerated for clarity of illustration.

FIG. 18 is a top view illustrating the conductive pattern formed on the substrate to form the circuit elements of FIG. 16, like structures having like numbers. In the planar view, second terminal 122 of the integrated circuit is visible. Underneath the integrated circuit, first terminal 133 forms one plate of capacitor 137, substrate pad 121 forming the other plate. Substrate pad 121 is coupled to the inside terminal 125 of the antenna coil. Unitary substrate 121 is also coupled to substrate pad 127, forming one plate of tuning capacitor 135. When first substrate 40 is folded onto second substrate 41, substrate pad 123 forms the other plate of capacitor 135. Substrate pad 124 is coupled to the outside terminal 126 of the antenna coil. Substrate pad 124 is also coupled to substrate pad 123, forming one plate of top coupling capacitor 123, the other plate being formed by the second terminal 122 of the integrated circuit. The circuit illustrated in FIG. 16 is thereby formed.

In another embodiment, substrate contact pads 124 and 123 of FIG. 18 can be merged into a single large conductive structure on first substrate 41. The appropriate capacitors are then formed where the large conductive structure overlaps contact pad 122 of the integrated circuit and substrate contact pad 127.

Figure 19:
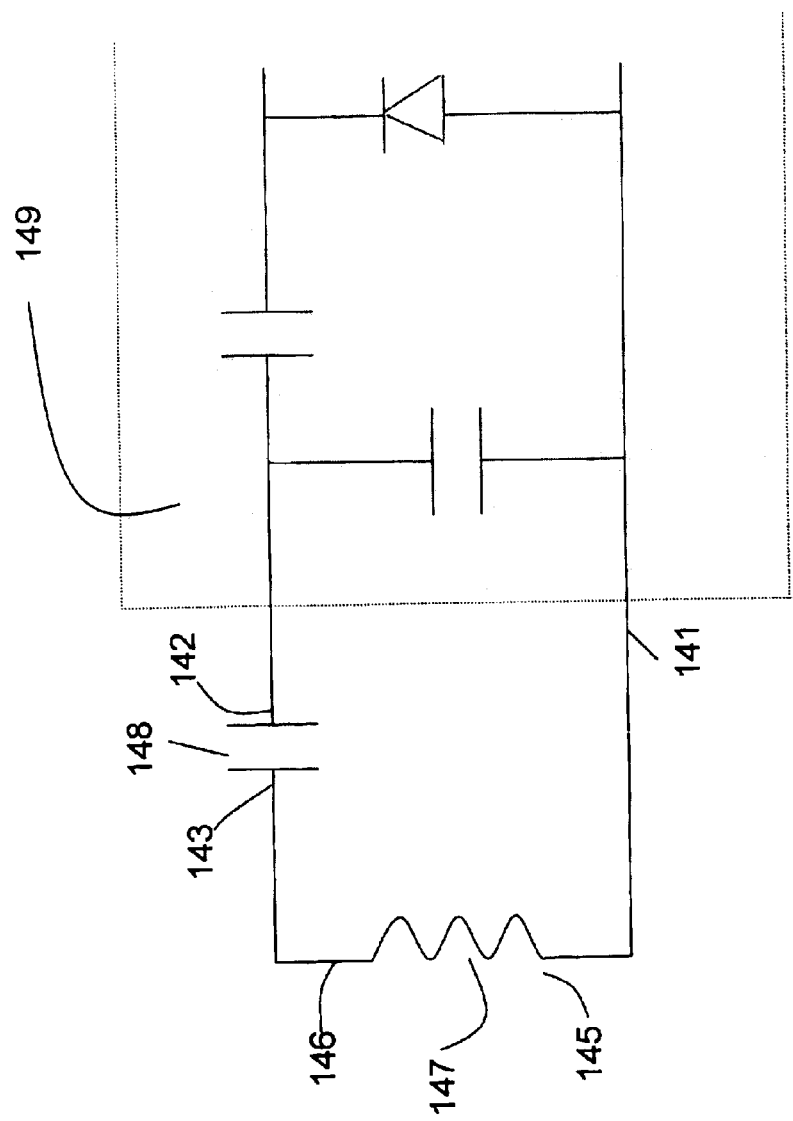
FIG. 19 is a schematic diagram of another embodiment of the present invention.

FIG. 19 is a schematic diagram illustrating another embodiment wherein an external antenna inductor 147 and a coupling capacitor 148 are produced on the substrate and are connected to an RFID integrated circuit without making openings in the dielectric layer. Circuitry 149 resides on the integrated circuit.

Figure 20:
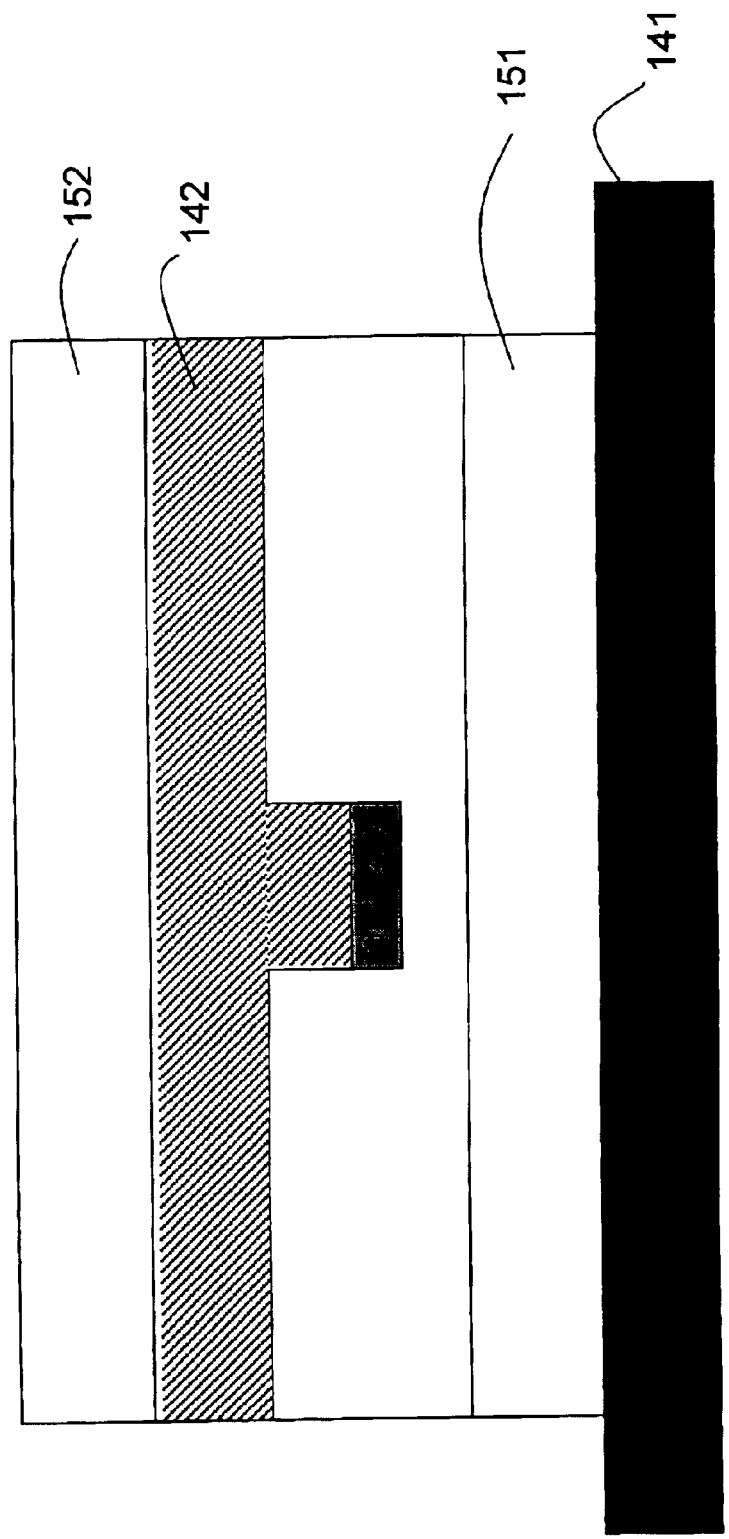
FIG. 20 is a cross sectional diagram illustrating the mounting of the integrated circuit to form the circuit of FIG. 19. Dimensions of the components are exaggerated for clarity of illustration.

FIG. 20 is a cross sectional diagram illustrating the mounting of the integrated circuit in this embodiment. The integrated circuit has a first terminal 151 on the back surface and a second terminal on the front surface 142. Second terminal 142 comprises a metal layer on the front surface of the integrated circuit. The integrated circuit is mounted with conductive adhesive onto substrate contact 151, first terminal thereby coupled to substrate contact 151. In one embodiment, a, dielectric layer 152 is then formed over the integrated circuit and the conductive pattern formed on the substrate. In another embodiment, a dielectric layer is formed on the surface of the integrated circuit, and dielectric layer 152 is not formed. In this case, the integrated circuit couples to the conductive pattern on the substrate utilizing capacitive coupling without making direct electrical contact.

Figure 21:
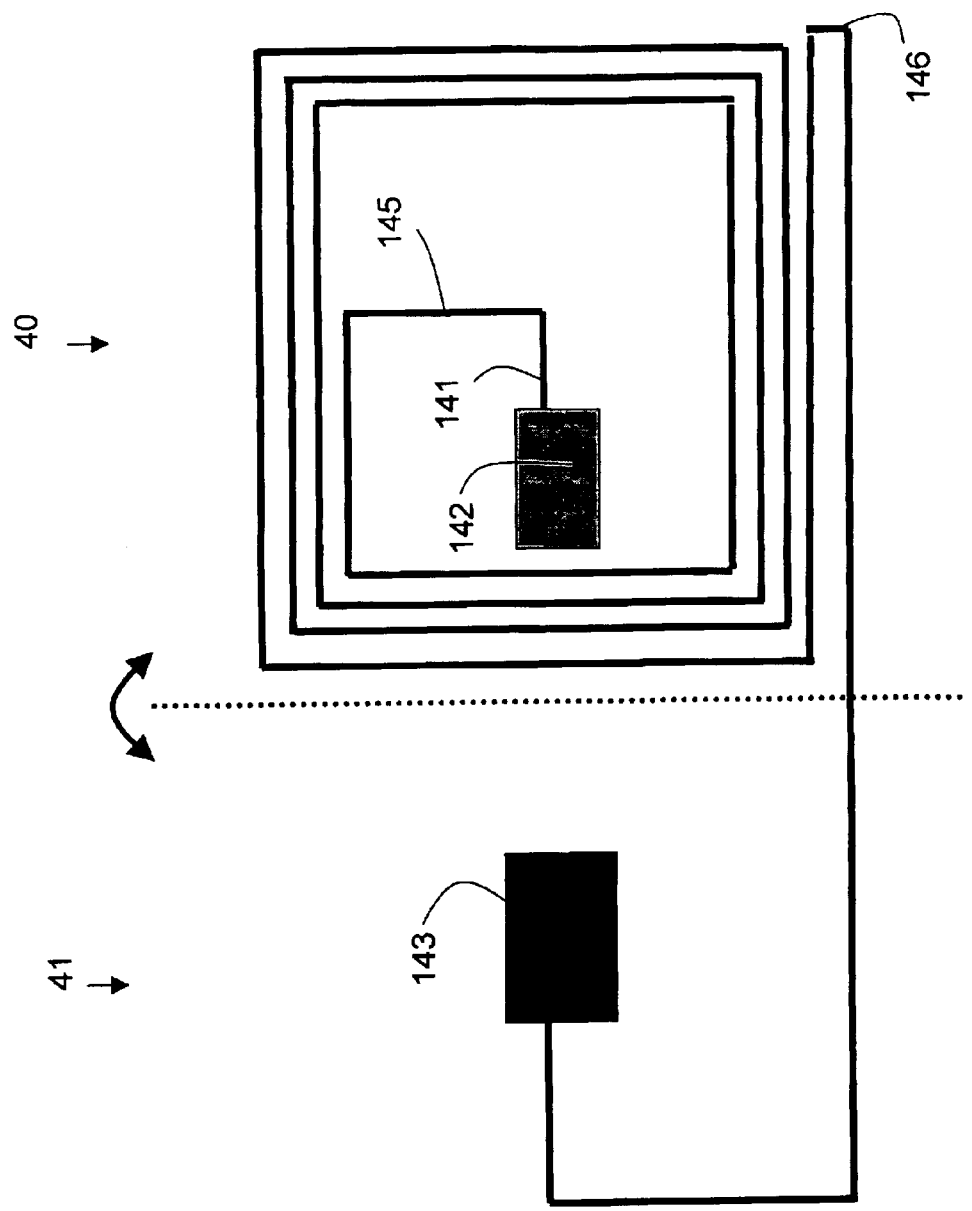
FIG. 21 is a top view illustrating the conductive pattern to form the circuit of FIG. 19. Dimensions of the components are exaggerated for clarity of illustration.

FIG. 21 is a top view illustrating the conductive pattern formed on the substrate to form the circuit elements of FIG. 19, like structures having like numbers. In the planar view, second terminal 142 of the integrated circuit is visible. Underneath the integrated circuit is substrate pad 141 to which the first terminal of the integrated circuit is coupled. When first substrate 40 is folded onto second substrate 41, second terminal 142 of the integrated circuit forms one plate of coupling capacitor 148 and substrate pad 143 forms the other plate. Substrate pad 143 is coupled to the outside terminal 146 of the inductor antenna 147. The inner terminal 145 of the inductor antenna 147 is coupled substrate pad 141, which is in turn coupled to first terminal 151 of the integrated circuit. The circuit illustrated in FIG. 19 is thereby formed.

Figure 22:
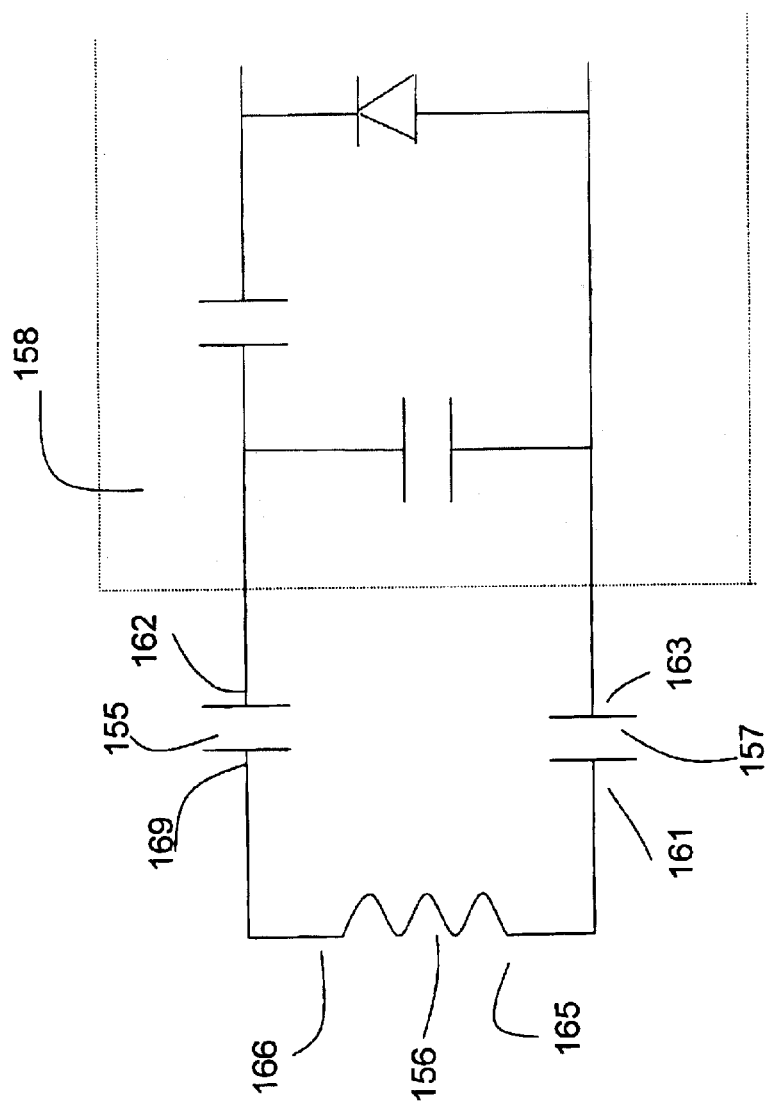
FIG. 22 is a schematic diagram of another embodiment of the present invention.

FIG. 22 is a schematic diagram illustrating another embodiment wherein an external antenna inductor 156, a top coupling capacitor 155 and a bottom coupling capacitor 157 are produced on the substrate and are connected to an RFID integrated circuit without making openings in the dielectric. Circuitry 158 resides on the integrated circuit.

Figure 23:
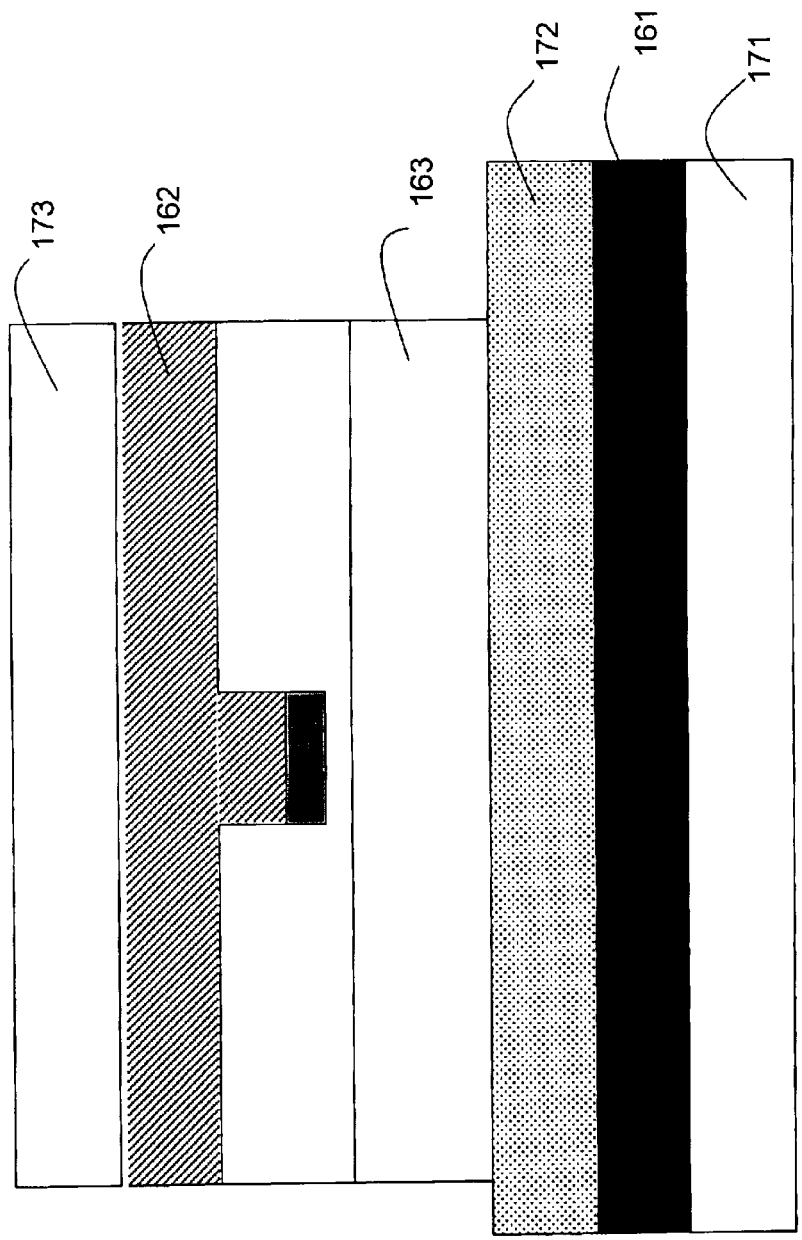
FIG. 23 is a cross-sectional diagram illustrating the mounting of the integrated circuit to form the circuit of FIG. 22. Dimensions of the components are exaggerated for clarity of illustration.

FIG. 23 is a cross sectional diagram illustrating the mounting of the integrated circuit in this embodiment. A conductive layer is deposited on top of unitary substrate 161, and is then patterned and etched. A dielectric layer 172 is formed on top of conductive layer 161. The integrated circuit is mounted on top of dielectric layer 172. The integrated circuit has a first terminal 163 on the back surface and a second terminal 162 on the front surface. Second terminal 162 comprises a metal layer on the front surface of the integrated circuit overlying an inter-dielectric layer on the integrated circuit, making contact to conductive layers below via appropriate openings in the inter-dielectric layer on the integrated circuit. In one embodiment, a dielectric layer 173 is formed on the front surface of the integrated circuit. In another embodiment, a dielectric layer is formed oh the integrated circuit and dielectric layer 173 is not formed. No openings are made in dielectric layer 172.

Figure 24:
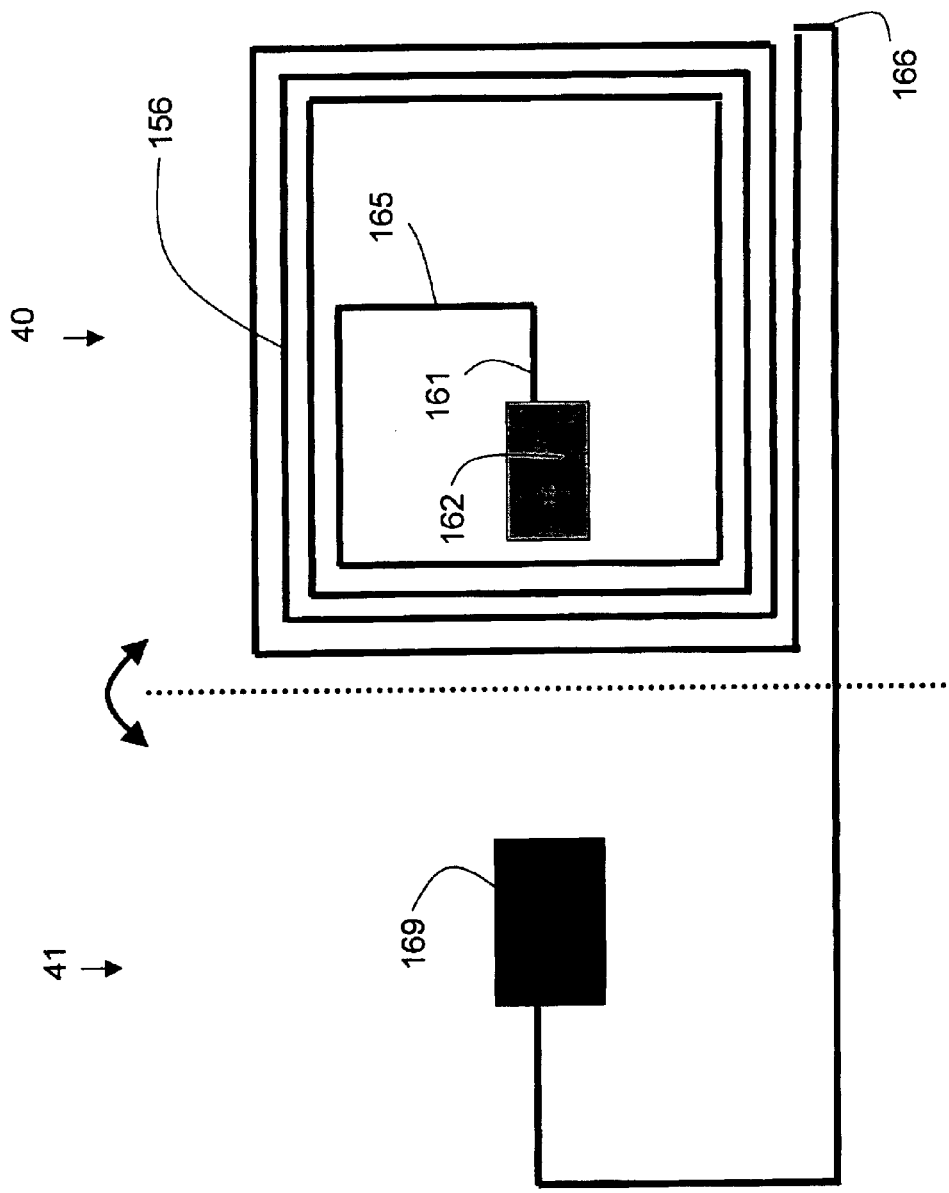
FIG. 24 is a top view illustrating the conductive pattern to form the circuit of FIG. 22. Dimensions of the components are exaggerated for clarity of illustration.

FIG. 24 is a top view illustrating the conductive pattern formed on the substrate to form the circuit elements of FIG. 22, like structures having like numbers. In the planar view, second terminal 162 of the integrated circuit is visible. Underneath the integrated circuit, first terminal 163 forms one plate of capacitor 157, substrate pad 161 forming the other plate. Substrate pad 161 is coupled to the inside terminal 165 of the antenna inductor 156. When first substrate 40 is folded onto second substrate 41, substrate pad 169 and second terminal 162 of the integrated circuit form the plates of capacitor 155. Substrate pad 169 is coupled to the outside terminal 166 of antenna inductor 156. The circuit illustrated in FIG. 22 is thereby formed.

In another embodiment, the circuit of FIG. 22 is produced utilizing an integrated circuit that has first terminal 162 and second terminal 163 on the front surface.

Figure 25:
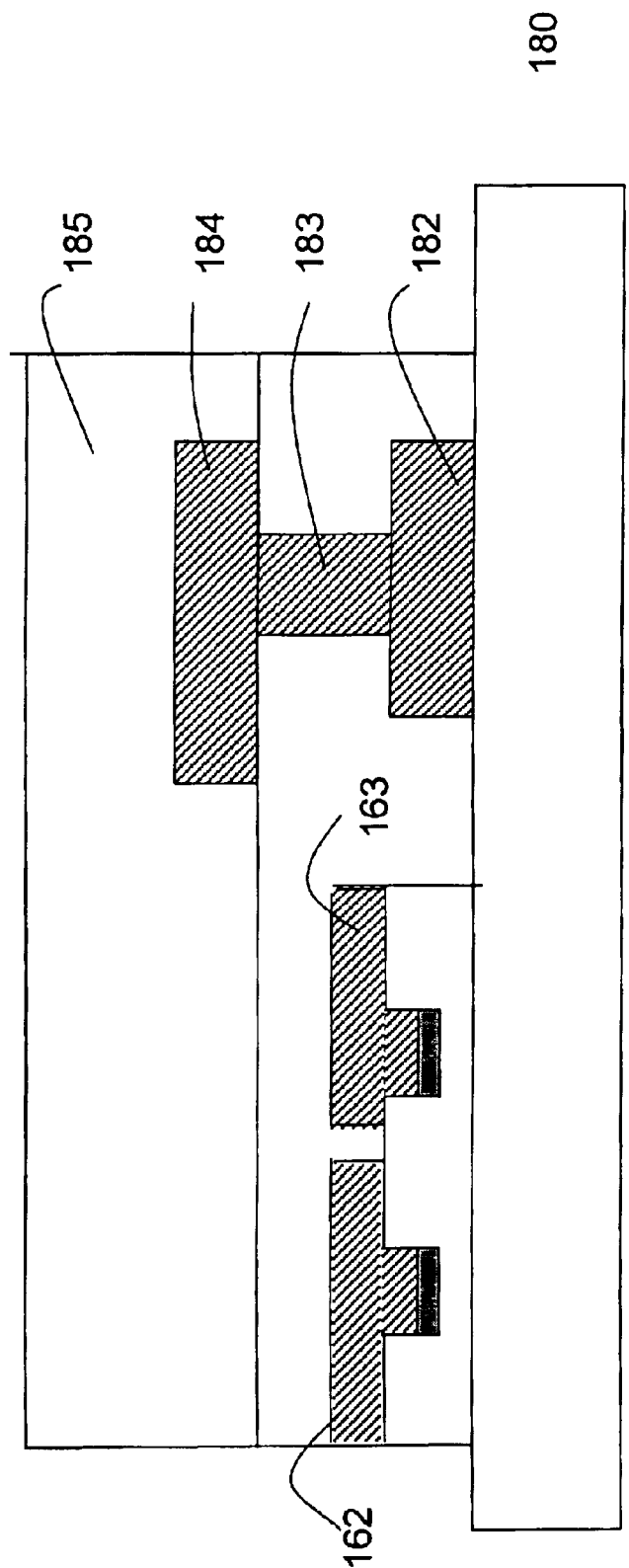
FIG. 25 is a cross sectional diagram illustrating the mounting of the integrated circuit having two terminals on the front surface to form the circuit of FIG. 22. Dimensions of the components are exaggerated for clarity of illustration.

FIG. 25 illustrates the mounting of the integrated circuit with first terminal 162 and second terminal 163 on the front surface of the integrated circuit. A first conductive layer 182 is formed on the unitary substrate 180, and is then patterned and etched. The integrated circuit is then mounted on unitary substrate 180 in a region where the conductive material in the first conductive layer 182 has been etched away. First dielectric layer 183 is formed over the integrated circuit and on top of first conductive layer 182. Second conductive layer 184 is formed over first dielectric layer 184, and is then patterned and etched. Connections between conductive traces of first conductive layer 182 is coupled to conductive traces of second conductive layer 184 via openings formed in first dielectric layer 184. Second dielectric layer 185 is formed on top of second conductive layer 184. No openings are formed in second dielectric layer 185.

FIG. 26 is a top view illustrating the conductive pattern in first conductive layer 182 and second conductive layer 184 to form the circuit of FIG. 22. When first substrate 40 is folded onto second substrate 41, substrate contact pad 169 and integrated circuit terminal 169 forms capacitor 155. Substrate contact pad 169 is coupled to the inside terminal 165 of antenna coil 156 via conductive trace 190 of the first conductive layer, opening 193 in the first dielectric layer, conductive trace 191 of the second conductive layer, opening 194 in the first dielectric layer, and conductive trace 195. The outer end terminal 166 of antenna inductor 156 is coupled to substrate pad 161. Substrate contact 161 and integrated circuit terminal 163 form the plates of capacitor 157. The circuit illustrated in FIG. 22 is thereby formed.

In summary, the present invention provides a method for producing an electrical circuit, such as an RFID tag, on a substrate utilizing simple and economical methods to form antenna structures, capacitor structures and conductive traces to interconnect the circuit elements formed on the substrate and to connect the contact pads of one or more integrated circuits that are mounted on the substrate. These integrated circuit elements are used to form antennas, tuning capacitors, and coupling capacitors of resonant circuits external to the integrated circuit. A conductivity layer is formed and patterned on a substrate, substrate comprising paper, sheets of plastic, polypropylene, polyolefin, or like materials. A dielectric layer is formed on top of the conductive layer. In one embodiment, openings through the dielectric layer to the conductive layer are formed in regions where contact to the conductive layer is desired. In another embodiment, no openings are made in the dielectric layer. The integrated circuit is then adhered to the substrate, either on the dielectric layer or in an opening making contact with the conductivity layer, depending on the electrical connections desired. A portion of the substrate is then folded onto itself so that contact points on one side of the fold will align with contact points on the other side of the fold or to contact pads on the integrated circuit, thereby electrically coupling the aligned contact points. In addition, capacitor circuit elements are formed when two conductive regions on the substrate covered with the dielectric layer align when a portion of the substrate is folded onto itself. Alternatively, the folded portion of the substrate and the unfolded portion of the substrate could be cut apart rather than folded, or the two portions could be produced separately.

The foregoing description is only illustrative of the invention. Various alternatives and modifications can be devised by those skilled in the art without departing from the invention. In particular, wherever a device is connect or coupled to another device, additional devices may be present between the two connected devices. Further, though the above described embodiments make reference to an integrated circuit having one pad or two pads on the surface of a single integrated circuit, the invention can apply to any number of pads on any number of integrated circuits. Further, though the above-described embodiments make reference to a coil antenna, the present invention also applies to other type of antenna constructed with conductive layers including dipole antennas and fractal antennas. Further, though the above-described embodiments make reference to "folding" the two portions of the substrate, the portions of substrate could also be cut apart or produced independently. Further, the RFID tags described in the embodiments herein could be laminated in order to protect the components on the substrate while still encompassing the scope of this invention. Further, though the electrodes of the capacitors formed in the above-described embodiments refer to the electrodes completely aligning, a smaller capacitance could be provided if the electrodes overlapped only partially. Further, though reference is made in the embodiments to a coil inductor antenna, other antenna types formed with other patterns in the conductive layer are within the scope of this invention. Further, though the embodiments described utilize primarily a single layer metal process on the substrate, the principles of this invention apply to two level metal processes and multi-level metal process on the substrates. Accordingly, the present invention embraces all such alternatives, modifications, and variances that fall within the scope of the appended claims.

What is claimed is:

1. An electrical circuit comprising:
   (a) first and second substrates,
   (b) a first conductive layer formed and patterned on the first substrate, between the first and second substrates, wherein the pattern of the first conductive layer includes a selection from the group of an inductor coil having inner and outer terminals, a dipole antenna, and a fractal antenna, (c) a second conductive layer formed and patterned on the second substrate, between the first and second substrates, (d) a dielectric layer separating at least a portion of the first conductive layer from at least a portion of the second conductive layer, and (e) at least one integrated circuit (IC), each IC mounted between the first and second substrates and each IC coupled to at least one of the first and second conductive layers.

2. The electrical circuit of claim 1 wherein the substrate includes a flexible substrate.

3. The electrical circuit of claim 1 wherein the substrate is selected from the group consisting of paper, plastic, polypropylene and polyolefin.

4. The electrical circuit of claim 1 wherein the conductive layer is formed from the group consisting of printed conductive ink, a chemically etched deposited conductive layer, and a stamped metal adhered to the substrate.

5. The electrical circuit of claim 1 wherein the first and second substrates are joined and comprise a unitary substrate.

6. The electrical circuit of claim 1 wherein the first and second conductive layers comprise a unitary conductive layer.

7. The electrical circuit of claim 1 wherein each IC mounted between the first and second substrates includes each IC mounted to at least one of the first and second conductive layers.

8. The electrical circuit of claim 1 wherein each IC mounted, between the first and second substrates includes each IC mounted to at least one of the first and second substrates.

9. The electrical circuit of claim 8 further including conductive adhesive fastening each IC to at least one of the first and second substrates.

10. The electrical circuit of claim 1 wherein the dielectric layer includes nonconductive tape.

11. The electrical circuit of claim 1 wherein each IC coupled to at least one of the first and second conductive layers includes at least one of the first and second dielectric layers having at least one opening formed therein permitting coupling between each IC and at least one of the first and second conductive layers.

12. The electrical circuit of claim 1 wherein each IC coupled to at least one of the first and second conductive layers includes each IC mounted to at least one of the first and second conductive layers.

13. The electrical circuit of claim 1 wherein the dielectric layer further separates each IC from at least one of the first and second conductive layers.

14. The electrical circuit of claim 1 further including an interior conductive layer coupled to at least one IC and at least one of the first and second conductive layers.

15. The electrical circuit of claim 1 further including an interior conductive layer coupled to the first and second conductive layers.

16. An electrical circuit comprising:

(a) a substrate having at least one fold formed therein, (b) a conductive layer formed and patterned on the substrate, wherein the pattern of the conductive layer includes a selection from the group of an inductor coil having inner and outer terminals, a dipole antenna, and a fractal antenna, (c) a dielectric layer formed on at least a portion of the conductive layer, and (d) at least one integrated circuit (IC), each IC mounted within the fold of the substrate and each IC coupled to the conductive layer.

17. The electrical circuit of claim 16 wherein each IC mounted within the fold of the substrate includes each IC mounted to the dielectric layer.

18. The electrical circuit of claim 16 wherein each IC mounted within the fold of the substrate includes each IC mounted to the conductive layer.

19. The electrical circuit of claim 16 wherein each IC mounted within the fold of the substrate includes each IC mounted to the substrate.

20. The electrical circuit of claim 16 wherein each IC coupled to the conductive layer includes the dielectric layer having at least one opening formed therein permitting coupling between each IC and the conductive layer.

21. The electrical circuit of claim 16 wherein each IC coupled to the conductive layer includes each IC mounted to the conductive layer.

22. The electrical circuit of claim 16 wherein the dielectric layer further separates each IC from the conductive layer.

23. The electrical circuit of claim 16 further including an interior conductive layer coupled to at least one IC and the conductive layer.

24. The electrical circuit of claim 16 further including an interior conductive layer coupled to the conductive layer.

25. An electrical circuit comprising:

a substrate having first and second surfaces, the substrate being folded along a fold line so that the first surface comprises opposite facing portions;

a conductive layer formed and patterned on both opposite facing portions of the first surface to include overlapping conductive elements, wherein the pattern of the conductive layer includes a selection from the group of an inductor coil having inner and outer terminals, a dipole antenna, and a fractal antenna;

a dielectric layer separating at least a portion of the conductive layer formed and patterned on both opposite facing portions of the first surface; and an integrated circuit mounted to the substrate between the opposite facing portions and being coupled to the conductive layer.

26. The electrical circuit of claim 25 wherein the conductive layer comprises a spiral design on one of the facing portions to define a coil including a center contact pad at one end and a conductive trace at another end connected to a second contact pad on the other facing portion, the second contact pad overlapping the center pad.

27. The electrical circuit of claim 26 wherein the integrated circuit is connected between the center contact pad and the second contact pad.

28. The electrical circuit of claim 25 wherein the conductive layer comprises a first conductive region on one facing portion overlapping a second conductive region on the other facing portion, the first and second conductive regions separated by the dielectric layer to define a capacitor element.

* * * * *